(12) United States Patent
Wang et al.

(10) Patent No.: US 12,334,451 B2
(45) Date of Patent: Jun. 17, 2025

(54) SEMICONDUCTOR PACKAGE INCLUDING PACKAGE SUBSTRATE WITH DUMMY VIA AND METHOD OF FORMING THE SAME

(71) Applicant: Taiwan Semiconductor Manufacturing Company Limited, Hsinchu (TW)

(72) Inventors: Chin-Hua Wang, New Taipei (TW); Po-Chen Lai, Hsinchu (TW); Chun-Wei Chen, Taoyuan (TW); Shin-Puu Jeng, Po-Shan Village (TW)

(73) Assignee: Taiwan Semiconductor Manufacturing Company Limited, Hsinchu (TW)

(*) Notice: Subject to any disclaimer, the term of this patent is extended or adjusted under 35 U.S.C. 154(b) by 529 days.

(21) Appl. No.: 17/862,040

(22) Filed: Jul. 11, 2022

(65) Prior Publication Data
US 2024/0014147 A1 Jan. 11, 2024

(51) Int. Cl.
H01L 23/00 (2006.01)
H01L 21/48 (2006.01)
H01L 21/60 (2006.01)
H01L 23/31 (2006.01)
H01L 23/498 (2006.01)
H01L 23/538 (2006.01)

(52) U.S. Cl.
CPC ........ *H01L 23/562* (2013.01); *H01L 21/4853* (2013.01); *H01L 21/60* (2021.08); *H01L 23/3185* (2013.01); *H01L 23/49816* (2013.01); *H01L 23/5383* (2013.01); *H01L 23/5384* (2013.01); *H01L 24/16* (2013.01); *H01L 24/29* (2013.01); *H01L 24/32* (2013.01); *H01L 24/73* (2013.01); *H01L 2224/16227* (2013.01); *H01L 2224/2919* (2013.01); *H01L 2224/32225* (2013.01); *H01L 2224/73204* (2013.01)

(58) Field of Classification Search
CPC .................. H01L 23/562; H01L 23/5384; H01L 23/5386
See application file for complete search history.

(56) References Cited

U.S. PATENT DOCUMENTS

2005/0280120 A1* 12/2005 Tomita ................. H01L 23/522
257/632
2020/0152546 A1* 5/2020 Refai-Ahmed ....... H01L 23/481
2022/0068881 A1* 3/2022 Jang ........................ H01L 24/32
2022/0319944 A1* 10/2022 Park ........................ H01L 24/92

* cited by examiner

*Primary Examiner* — Errol V Fernandes
(74) *Attorney, Agent, or Firm* — The Marbury Law Group, PLLC

(57) ABSTRACT

A semiconductor package may include a package substrate including a dummy via on a first side of the package substrate, an interposer module on a second side of the package substrate opposite the first side of the package substrate, and a stiffener ring on the second side of the package substrate and including an edge that is substantially aligned with the dummy via.

20 Claims, 18 Drawing Sheets

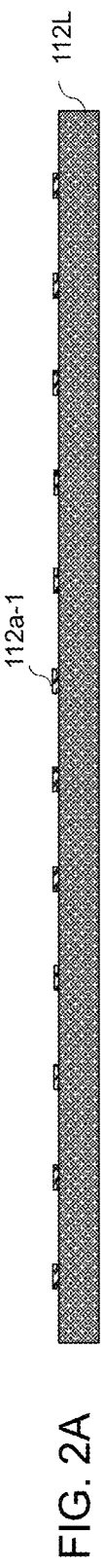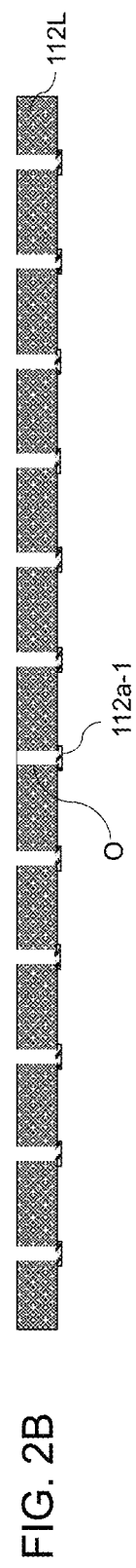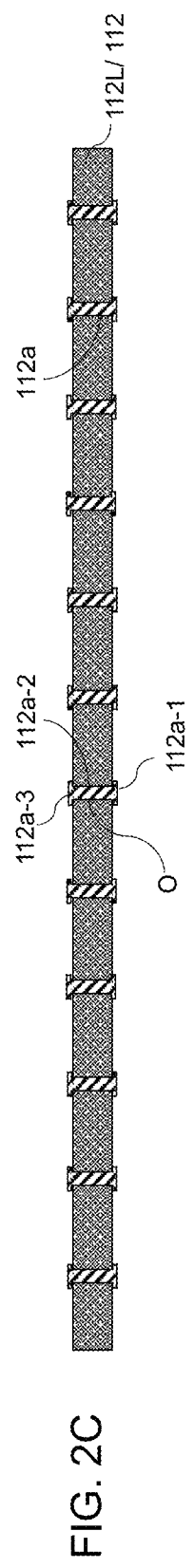

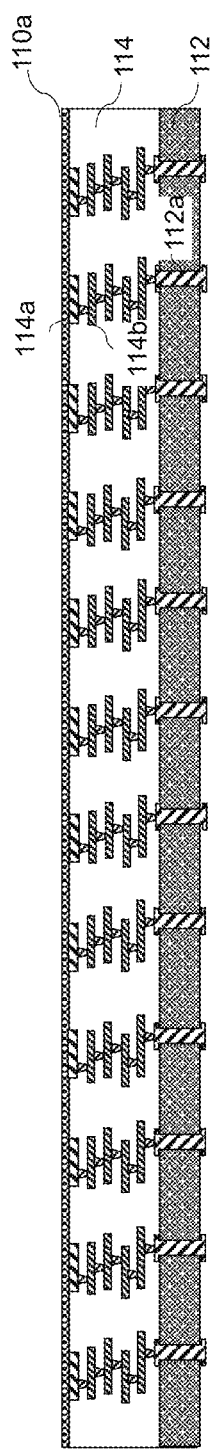
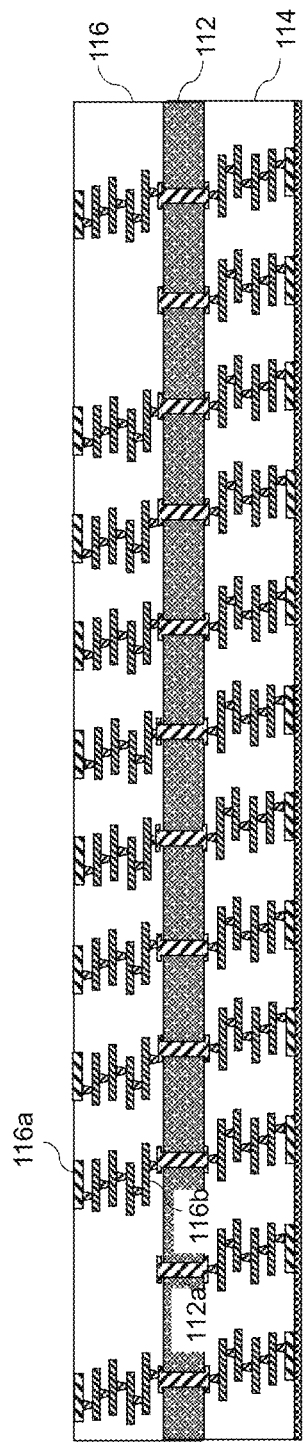
FIG. 2D
FIG. 2E

SEMICONDUCTOR PACKAGE INCLUDING PACKAGE SUBSTRATE WITH DUMMY VIA AND METHOD OF FORMING THE SAME

BACKGROUND

Interfaces between a fan-out wafer level package (FOWLP) and an underfill material portion are subjected to mechanical stress during subsequent handling of an assembly of the FOWLP, the underfill material portion, and a packaging substrate, such as the mechanical stress associated with attaching the packaging substrate to a printed circuit board (PCB). In addition, interfaces between a FOWLP and an underfill material portion are subjected to mechanical stress during use within a computing device, such as when a mobile device is accidently dropped to cause a mechanical shock during usage. Cracks may be formed in the underfill material, and may induce additional cracks in a semiconductor die, solder material portions, interposers, and/or various dielectric layers within a semiconductor die or within a packaging substrate. A semiconductor package may typically include one or more semiconductor devices (e.g., semiconductor die, system on chip (SOC) device, high bandwidth memory (HBM) device) that are mounted on a package substrate. Thus, suppression of the formation of cracks in the underfill material and other package components is desired. A stiffener ring or stiffener lid may be formed on the package substrate in order to provide rigidity to the package substrate and mitigate against cracks at various levels in the semiconductor package.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A is a vertical cross-sectional view of an intermediate structure including a core material layer according to one or more embodiments.

FIG. 2B is a vertical cross-sectional view of an intermediate structure including openings in the core material layer according to one or more embodiments.

FIG. 2C is a vertical cross-sectional view of an intermediate structure including the through via in the core according to one or more embodiments.

FIG. 2D is a vertical cross-sectional view of an intermediate structure including the package substrate upper dielectric layer according to one or more embodiments.

FIG. 2E is a vertical cross-sectional view of an intermediate structure including the package substrate lower dielectric layer according to one or more embodiments.

DETAILED DESCRIPTION

Figure 1A:
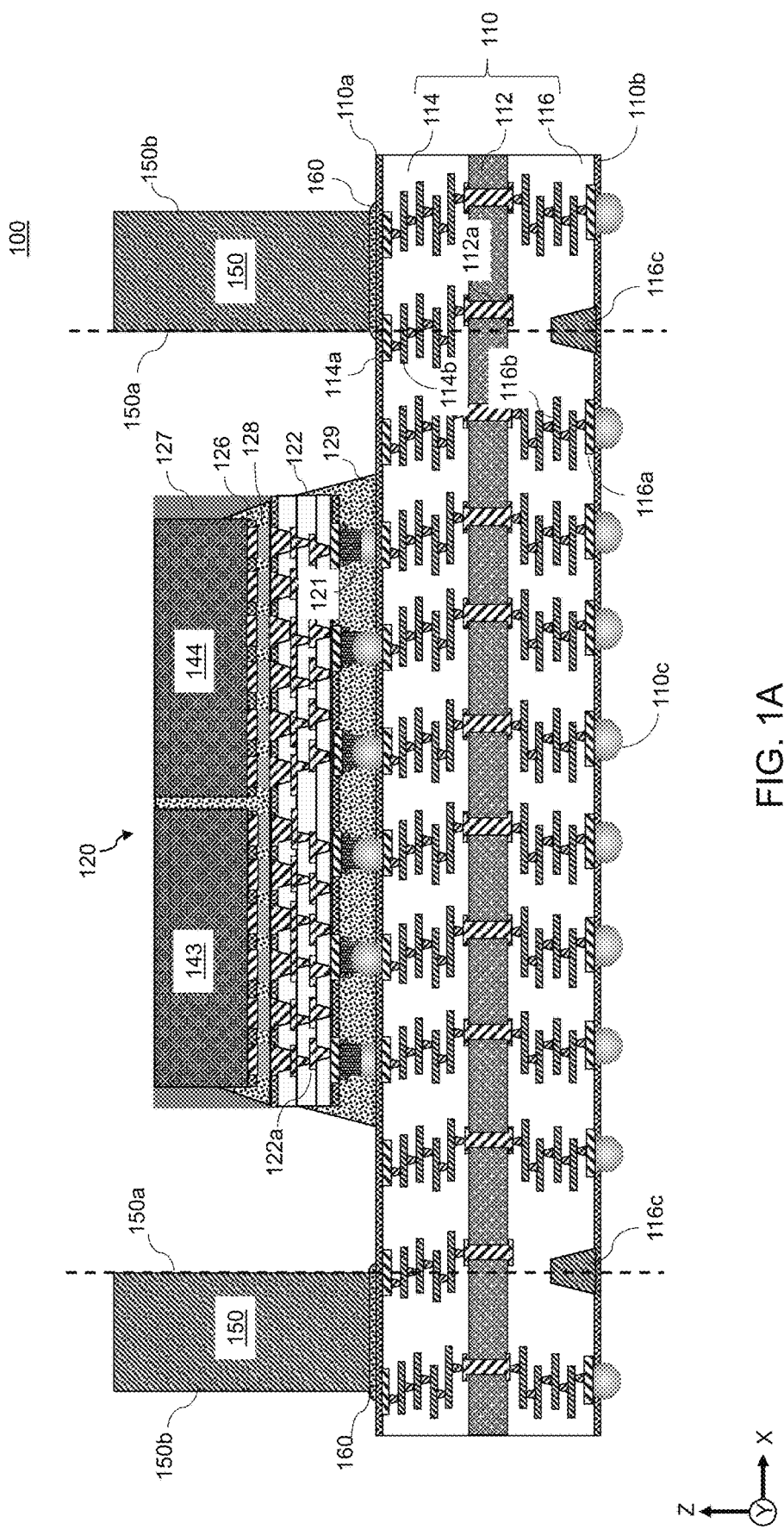
FIG. 1A is a vertical cross-sectional view of a semiconductor package according to one or more embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

In a related semiconductor package, after a thermal cycle reliability test, a crack in the package substrate may be detected. In particular, the crack may be detected in the package substrate on a ball grid array (BGA) side of a dielectric layer (e.g., Ajinomoto Build-up Film (ABF) layer) around an edge of a stiffener ring. The crack may penetrate into the dielectric layer and stop at the core of the package substrate, or at a via structure in the core. The crack may be particularly common near a metal trace (e.g., copper trace) in the package substrate.

A possible cause of the crack may include a strong stiffener ring design. The stiffener ring may be intended to constrain warping of the package. However, the stiffener ring may induce enhanced tensile stress on the BGA side of the dielectric layer of the package substrate.

One or more embodiments of the present disclosure may include a semiconductor package (e.g., organic/silicon interposer package, semiconductor device) with an enhanced substrate design. In particular, the package substrate may include one or more dummy vias that may mitigate development of a crack in the package substrate. The dummy vias may be arranged, for example, in an array (e.g., having rows and columns). More particularly, the one or more dummy vias may be located on the BGA side of the dielectric layer on substrate, and may enhance a structure of the semiconductor package, and thereby, inhibit (e.g., prevent) a crack issue (e.g., metal trace crack issue) in the package substrate. The various embodiment substrate designs may improve reliability of the semiconductor package.

The semiconductor package may include, for example, a stiffener ring or a stiffener lid on a surface of the package substrate. The one or more dummy vias (e.g., dummy via array) may be located close to an edge of the stiffener ring. In particular, a centerline of the one or more dummy vias may be substantially aligned with the edge of the stiffener ring. The stiffener lid may include a ring and a cap integrated together. The ring may surround the semiconductor device and the cap may cover the ring and the semiconductor device.

In one or more embodiments, the centerline of the one or more dummy vias may be located by a distance D from an edge of the stiffener foot that is greater than 0.1 mm and less than 2 mm (0.1<D<2 mm). The one or more dummy vias may have either a stacked (e.g., multi-stacked such as 2-stacking, 3-stacking, etc.) or unstacked structure. A total height A of the one or more dummy vias may be less than a thickness B of the dielectric layer on the BGA side of the package substrate (A<B). An area ratio of the one or more dummy vias may be greater than 0.1 and less than 0.9. That is, where the inner edge of the stiffener ring has a length L and a width W, the following may be satisfied: $0.1<\Sigma C/[2D*(L+W)]<0.9$, where C is the area of each dummy via in a via array; D is the distance from the centerline of the one or more dummy vias (which may be coincident with an edge of the stiffener foot) to the edge of the dummy via or edge of the dummy via array; L is the length of the inner edge of the stiffener ring 150; and W is the width of the inner edge of the stiffener ring 150. In some embodiments, D may be the radius of the dummy via. In other embodiments, D may be the distance from the centerline of the dummy via array to the edge of the dummy via array.

FIG. 1A is a vertical cross-sectional view of a semiconductor package 100 according to one or more embodiments. Generally, the semiconductor package 100 may include a package substrate 110, an interposer module 120 on the package substrate 110, and a stiffener ring 150 adhered and/or affixed to the package substrate 110 adjacent to the interposer module 120. The stiffener ring 150 may include an inner edge 150*a* and an outer edge 150*b*.

The package substrate 110 may include, for example, a core 112, a package substrate upper dielectric layer 114 formed on the core 112 (e.g., a first side or chip-side of the package substrate 110), and a package substrate lower dielectric layer 116 formed on the core 112 (e.g., a second side or board-side of the package substrate 110). In particular, the package substrate 110 may include a build-up film substrate such as an Ajinomoto build-up film (ABF) substrate. That is, in at least one embodiment, each of the package substrate upper dielectric layer 114 and the package substrate lower dielectric layer 116 may be described as an ABF layer.

The core 112 may help to provide rigidity to the package substrate 110. The core 112 may include, for example, an epoxy resin such as a bismaleimide triazine epoxy (BT epoxy) and/or a woven glass laminate. The core 112 may alternatively or in addition include an organic material such as a polymer material. In particular, the core 112 may include a dielectric polymer material such as polyimide (PI), benzocyclobutene (BCB), or polybenzobisoxazole (PBO). Other suitable dielectric materials are within the contemplated scope of disclosure.

The core 112 may include one or more through vias 112*a*. The through vias 112*a* may extend from a lower surface of the core 112 to an upper surface of the core 112. The through vias 112*a* may allow an electrical connection between the package substrate upper dielectric layer 114 and the package substrate lower dielectric layer 116. The through vias 112*a* may include, for example, one or more layers and may include metals, metal alloys, and/or other metal-containing compounds (e.g., Cu, Al, Mo, Co, Ru, W, TiN, TaN, WN, etc.). Other suitable metal materials are within the contemplated scope of disclosure.

The package substrate upper dielectric layer 114 may be formed on an upper surface of the core 112. The package substrate upper dielectric layer 114 may include a plurality of layers and, in particular, may include a build-up film (e.g., ABF). The package substrate upper dielectric layer 114 may also include an organic material such as a polymer material. In particular, the package substrate upper dielectric layer 114 may include a dielectric polymer material such as polyimide (PI), benzocyclobutene (BCB), or polybenzobisoxazole (PBO). Other suitable dielectric materials are within the contemplated scope of disclosure.

The package substrate upper dielectric layer 114 may include one or more package substrate upper bonding pads 114a on a chip-side surface of the package substrate upper dielectric layer 114. In particular, the package substrate upper bonding pads 114a may be exposed on the chip-side surface of the package substrate upper dielectric layer 114. The package substrate upper dielectric layer 114 may also include one or more metal interconnect structures 114b. The metal interconnect structures 114b may be connected to the package substrate upper bonding pads 114a and the through vias 112a in the core 112. The metal interconnect structures 114b may include metal layers (e.g., copper traces) and metal vias connecting the metal layers. The package substrate upper bonding pads 114a and the metal interconnect structures 114b may include, for example, one or more layers and may include metals, metal alloys, and/or other metal-containing compounds (e.g., Cu, Al, Mo, Co, Ru, W, TiN, TaN, WN, etc.). Other suitable metal materials are within the contemplated scope of disclosure.

An upper passivation layer 110a may be formed on the chip-side surface of the package substrate upper dielectric layer 114. The upper passivation layer 110a may partially cover the package substrate upper bonding pads 114a. The upper passivation layer 114a may include silicon oxide, silicon nitride, low-k dielectric materials such as carbon-doped oxides, extremely low-k dielectric materials such as porous carbon doped silicon dioxide, a combination thereof or other suitable material.

The package substrate lower dielectric layer 116 may be formed on an lower surface of the core 112. The package substrate lower dielectric layer 116 may also include a plurality of layers and, in particular, may include a build-up film (e.g., ABF). The package substrate lower dielectric layer 116 may also include an organic material such as a polymer material. In particular, the package substrate lower dielectric layer 116 may include a dielectric polymer material such as polyimide (PI), benzocyclobutene (BCB), or polybenzobisoxazole (PBO). Other suitable dielectric materials are within the contemplated scope of disclosure.

The package substrate lower dielectric layer 116 may include one or more package substrate lower bonding pads 116a on a board-side surface of the package substrate lower dielectric layer 116. In particular, the package substrate lower bonding pads 116a may be exposed on the chip-side surface of the package substrate lower dielectric layer 116. The package substrate lower dielectric layer 116 may also include one or more metal interconnect structures 116b. The metal interconnect structures 116b may be connected to the package substrate lower bonding pads 116a and the through vias 112a in the core 112. The metal interconnect structures 116b may include metal layers (e.g., copper traces) and metal vias connecting the metal layers. The package substrate upper bonding pads 116a and the metal interconnect structures 116b may include, for example, one or more layers and may include metals, metal alloys, and/or other metal-containing compounds (e.g., Cu, Al, Mo, Co, Ru, W, TiN, TaN, WN, etc.). Other suitable metal materials are within the contemplated scope of disclosure.

A lower passivation layer 110b may be formed on the board-side surface of the package substrate lower dielectric layer 116. The lower passivation layer 110b may partially cover the package substrate lower bonding pads 116a. The lower passivation layer 110a may include silicon oxide, silicon nitride, low-k dielectric materials such as carbon-doped oxides, extremely low-k dielectric materials such as porous carbon doped silicon dioxide, a combination thereof or other suitable material.

The package substrate lower dielectric layer 116 may also include one or more dummy vias 116c. The dummy vias 116c may be formed in the board-side surface of the package substrate lower dielectric layer 116 and may or may not be exposed at the board-side surface of the package substrate lower dielectric layer 116. A height of the dummy vias 116c in the z-direction may be less than a thickness of the package substrate lower dielectric layer 116. That is, a thickness of the package substrate lower dielectric layer 116 may be greater than a thickness of the dummy vias 116.

The dummy vias 116c may be aligned with an edge of the stiffener ring 150. In particular, as illustrated in FIG. 1A, a centerline in the x-direction (as indicated by the dashed line in FIG. 1A) of the dummy via 116c may be substantially aligned with the inner edge 150a of the stiffener ring 150. Although it is not illustrated in FIG. 1A, at least some portion of the dummy vias 116c may be located underneath the interposer module 120 in the z-direction.

A lowermost surface of the dummy vias 116c may be substantially coplanar with the lowermost surface of the package substrate lower bonding pads 116a and with the board-side surface of the package substrate lower dielectric layer 116. The dummy vias 116c may be exposed at the board-side surface of the package substrate lower dielectric layer 116, or may be covered by another layer of the package substrate 110 such as the lower passivation layer 110b.

A ball-grid array (BGA) including a plurality of solder balls 110c may be formed on the board-side surface of the package substrate lower dielectric layer 116. The solder balls 110c may allow the semiconductor package 100 to be securely mounted on a substrate such as a printed circuit board (PCB) and electrically coupled to the PCB substrate. The solder balls 110c may contact the package substrate lower bonding pads 116a, respectively. The solder balls 110c may therefore be electrically connected to the package substrate upper bonding pads 114a by way of metal interconnect structures 116b, the through vias 112a and the metal interconnect structures 114b.

The interposer module 120 may be mounted by C4 bumps 121 on the package substrate upper bonding pads 114a in the package substrate 110. The interposer module 120 may include an interposer 122 which may include an organic material (e.g., dielectric polymer) or inorganic material (e.g., silicon). In particular, as illustrated in FIG. 1A, the interposer 122 may include a plurality of layers (e.g., dielectric polymer layers, silicon layers, etc.). The interposer 122 may include metal interconnects 122a connected to the C4 bumps 121.

The interposer module 120 may also include one or more semiconductor dies (e.g., semiconductor chips) mounted on the interposer 122. In particular, as illustrated in FIG. 1A, a first semiconductor die 143 and second semiconductor die 144 may be mounted on the interposer 122. The first semiconductor die 143 and second semiconductor die 144 may be mounted on the interposer 122, for example, by micro-bumps 128 that may be electrically connected to the metal interconnects 122a in the interposer 122. A second package underfill layer 129 may be formed under and around the interposer module 120 and the C4 bumps 121 so as to fix the interposer module 120 to the package substrate 110. The package underfill layer 129 may be formed of an epoxy-based polymeric material.

Each of the first semiconductor die 143 and second semiconductor die 144 may include, for example, a semiconductor die, a system on chip (SOC) die, a system on integrated chips (SoIC) die, a high-bandwidth memory (HBM) die and a dynamic random access memory (DRAM) die. In particular, the interposer module 120 may include a high-performance computing (HPC) application and may include, for example, an integrated graphics processing unit (GPU), application specific integrated circuit (ASIC), field-programmable gate array (FPGA), and HBM by chip on wafer on substrate (CoWoS) technology or integrated fan-out on substrate (INFO-oS) technology.

An interposer underfill layer 126 may be formed around the micro-bumps 128 and between the first semiconductor die 143 and the interposer 122 and between the second semiconductor die 144 and the interposer 122. The interposer underfill layer 126 may be formed as two separate portions under the first semiconductor die 143 and second semiconductor die 144 respectively. Alternatively, the interposer underfill layer 126 may be formed continuously under both of the first semiconductor die 143 and second semiconductor die 144. The interposer underfill layer 126 may also be formed between first semiconductor die 143 and the second semiconductor die 144. The interposer underfill layer 126 may also be formed of an epoxy-based polymeric material.

A molding material layer 127 may be formed over the first semiconductor die 143, the second semiconductor die 144, the interposer underfill layer 126 and the interposer 122. The molding material layer 127 may be formed of an epoxy molding compound (EMC).

The stiffener ring 150 may mounted on the package substrate 110 around the interposer module 120. The stiffener ring 150 may be securely fixed to the package substrate 110 by an adhesive 160 (e.g., a silicone adhesive or an epoxy adhesive). The stiffener ring 150 may be formed of a metal such as copper with a nickel coating, or an aluminum alloy. The stiffener ring 150 may provide rigidity to the package substrate 110.

Figure 1B:
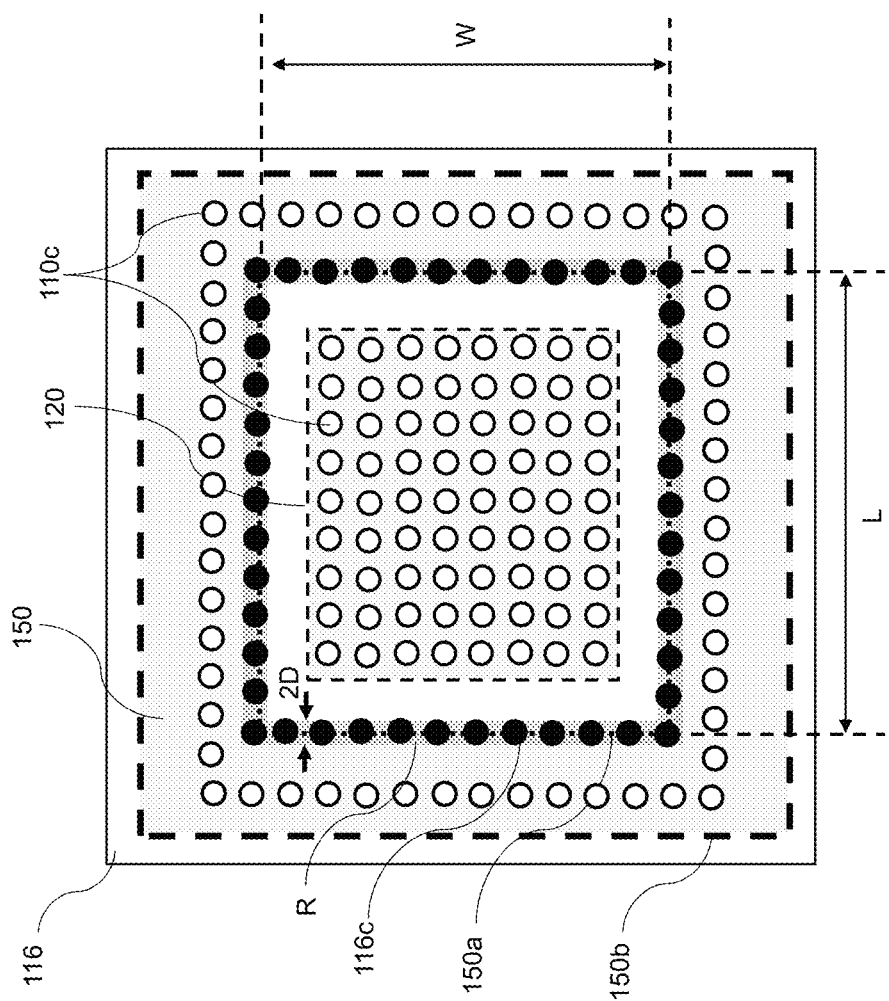
FIG. 1B is a plan view of the board-side surface of package substrate lower dielectric layer, according to one or more embodiments.

FIG. 1B is a plan view of the board-side surface of package substrate lower dielectric layer 116, according to one or more embodiments. A location of the stiffener ring 150 and the interposer module 120 on the opposing surface (e.g., chip-side surface) of the package substrate 110 is indicated by shading. The outer periphery of the interposer module 120 and the inner edge 150a and outer edge 150b of the stiffener ring 150 are also indicated by a dashed line in FIG. 1B.

As illustrated in FIG. 1B, the stiffener ring 150 may be located around an entire periphery of the interposer module 120. The solder balls 110c of the BGA may be located under the stiffener ring 150 and under the interposer module 120.

The dummy vias 116c may be located adjacent to solder balls 110c of the BGA. In particular, the dummy vias 116c may be formed between an inner set of solder balls 110c under the interposer module 120, and an outer set of solder balls 110c under the stiffener ring 150.

The dummy vias 116c may be formed around an entire periphery of the interposer module 120 in the plan view. In particular, the dummy vias 116c may be formed under the inner edge 150a of the stiffener ring 150 over the entire length of the inner edge 150a. The inner edge 150a may have a length L in the x-direction and a width W in the y-direction. Therefore, a total length of the inner edge 150a may be given by 2(L+W).

The dummy vias 116c may be substantially aligned under the inner edge 150a of the stiffener ring 150. Thus, in a plan view the dummy vias 116c may be arranged so as to have a ring shape substantially the same as a ring shape of the stiffener ring 150. As illustrated in FIG. 1B, the centerline of the dummy vias 116c may be coincident with inner edge 150a of the stiffener ring 150. The dummy vias 116c may extend away from the centerline by a distance D. Thus, a width (e.g., diameter) of the dummy vias 116c in the x-direction and y-direction may be 2D. In at least one embodiment, the distance D from the centerline of the dummy vias 116c to an edge of the dummy vias 116c may be greater than 0.1 mm and less than 2 mm.

The dummy vias 116c may be located in a region R having a width that is substantially the same as the width (2D) of the dummy vias 116c.

It may be preferable to set a density of the dummy vias 116c in the region R. This may be done by setting an area ratio $R_a$ for the dummy vias 116c. The area ratio $R_a$ may be defined as the ratio of the total area $A_{DV}$ of the dummy vias 116c to the area $A_R$ of a region R in which the dummy vias 116c are located (i.e., $R_a = A_{DV}/A_R$). The area ratio $R_a$ may be, for example, greater than 0.1 and less than 0.9.

For example, in FIG. 1B, there may be a total of 46 dummy vias 116c. Each dummy via 116c may have a circular horizontal cross sectional profile with a radius r (note that in this particular example, the radius r may be equal to the distance D). Thus, the total area $A_{DV}$ of the dummy vias 116c would be given by $46 \pi r^2$. The area $A_R$ of region R may be given by $2D \times 2(L+W)$. Thus, the area ratio $R_a$ would be given by $46 \pi r^2 / [4D(L+W)]$.

FIG. 2A is a vertical cross-sectional view of an intermediate structure including a core material layer 112L according to one or more embodiments. The core 112 may be formed by first preparing a core material layer 112L. The core material layer 112L may include a layer or plurality of layers of epoxy resin and/or a woven glass laminate. Lower via pads 112a-1 may then be formed on the core material layer 112L. To form the lower via pads 112a-1, a layer of metal material (e.g., copper, aluminum or other suitable conductive materials) may be deposited (e.g., by CVD, PVD or other suitable deposition technique) on the core material layer 112L. The metal layer may be etched (e.g., by wet etching, dry etching, etc.) so as to form the metal bonding pads 112a-1.

FIG. 2B is a vertical cross-sectional view of an intermediate structure including openings O in the core material layer 112L according to one or more embodiments. The openings O may be formed in the core material layer 112L at locations corresponding to the lower via pads 112a-1. The openings O may be formed by using a photolithographic process. The photolithographic process may include forming a patterned photoresist mask (not shown) on the core material layer 112L, and etching (e.g., wet etching, dry etching, etc.) the exposed upper surface of the core material layer 112L through openings in the photoresist mask. The photoresist mask may be subsequently removed by ashing, dissolving the photoresist mask or by consuming the photoresist mask during the etch process.

FIG. 2C is a vertical cross-sectional view of an intermediate structure including the through via 112a in the core 112 according to one or more embodiments. Via columns 112a-2 and upper via pads 112a-3 may then be formed in the same step or consecutive steps, to complete the formation of the through vias 112a and the core 112. To form the via columns 112a-2 and upper via pads 112a-3 in one step, for example, a metal layer (e.g., copper, aluminum or other suitable conductive materials) may be deposited in the openings O and on an upper surface of the core material layer 112L by CVD, PVD or other suitable deposition technique. The metal layer may be etched (e.g., by wet etching, dry etching, etc.) so as to form the via columns 112a-2 and upper via pads 112a-3.

FIG. 2D is a vertical cross-sectional view of an intermediate structure including the package substrate upper dielectric layer 114 according to one or more embodiments. The package substrate upper dielectric layer 114 may include a plurality of dielectric layers 114 that may be formed, for example, by chemical vapor deposition (CVD), physical vapor deposition (PVD), spin coating, lamination or other suitable deposition technique.

The metal layers (e.g., traces) and metal vias of the metal interconnect structures 114b may be formed layer-by-layer at the time of forming the plurality of dielectric layers of the package substrate upper dielectric layer 114. The metal interconnect structures 114b may be formed so as to contact the through vias 112a in the core 112. In particular, the metal layers (e.g., traces) and metal vias of the metal interconnect structures 114b may be formed by a semi-additive process (SAP).

The package substrate upper bonding pads 114a may be formed in an uppermost dielectric layer of the package substrate upper dielectric layer 114. The package substrate upper bonding pads 114a may be formed so as to contact the metal interconnect structures 114b. The package substrate upper bonding pads 114a may be formed by depositing a metal layer (e.g., copper, aluminum or other suitable conductive materials) on a dielectric layer of the package substrate upper dielectric layer 114. The metal layer may then be patterned by etching (e.g., by wet etching, dry etching, etc.) so as to form the package substrate upper bonding pads 114a.

The upper passivation layer 110a may then be formed on the surface of the uppermost dielectric layer of the package substrate upper dielectric layer 114. The upper passivation layer 110a may be formed so as to partially cover the package substrate upper bonding pads 114a. The upper passivation layer 110a may be formed, for example, by chemical vapor deposition (CVD), physical vapor deposition (PVD), spin coating, lamination or other suitable deposition technique.

FIG. 2E is a vertical cross-sectional view of an intermediate structure including the package substrate lower dielectric layer 116 according to one or more embodiments. The package substrate lower dielectric layer 116 may be formed by a process that is similar to the process of forming package substrate upper dielectric layer 114. The package substrate lower dielectric layer 116 may include a plurality of dielectric layers that may be formed, for example, by chemical vapor deposition (CVD), physical vapor deposition (PVD), spin coating, lamination or other suitable deposition technique.

The metal layers (e.g., traces) and metal vias of the metal interconnect structures 116b may be formed layer-by-layer at the time of forming the plurality of dielectric layers of the package substrate lower dielectric layer 116. The metal interconnect structures 116b may also be formed so as to contact the through vias 112a in the core 112. In particular, the metal layers (e.g., traces) and metal vias of the metal interconnect structures 116b may be formed by a semi-additive process (SAP).

The package substrate lower bonding pads 116a may be formed in an uppermost dielectric layer of the package substrate upper dielectric layer 116. The package substrate lower bonding pads 116a may be formed at locations corresponding to a location of the solder balls 110c of the BGA. The package substrate lower bonding pads 116a may also be formed so as to contact the metal interconnect structures 116b. The package substrate lower bonding pads 116a may be formed by depositing a metal layer (e.g., copper, aluminum or other suitable conductive materials) on a dielectric layer of the package substrate lower dielectric layer 116. The metal layer may then be patterned by etching (e.g., by wet etching, dry etching, etc.) so as to form the package substrate lower bonding pads 116a.

Figure 2F:
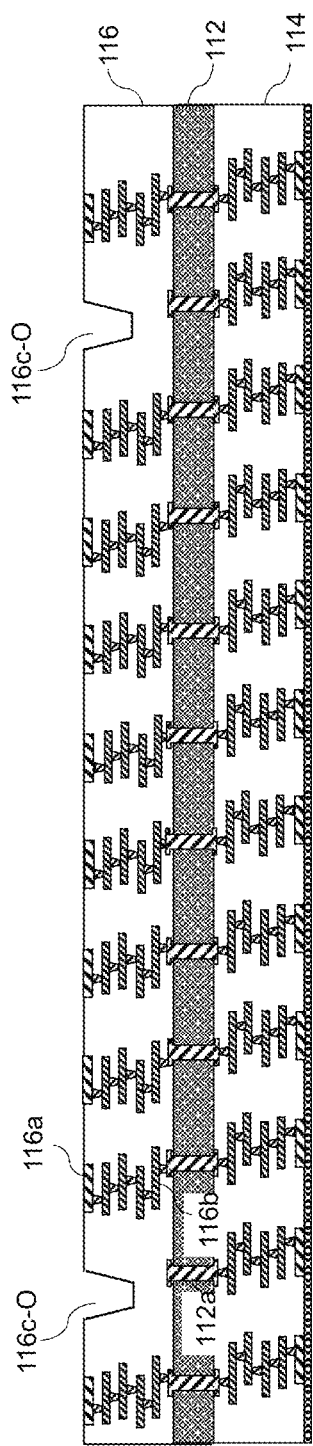
FIG. 2F is a vertical cross-sectional view of an intermediate structure including openings according to one or more embodiments.

FIG. 2F is a vertical cross-sectional view of an intermediate structure including openings 116c-O according to one or more embodiments. The openings 116c-O may be formed in the package substrate lower dielectric layer 116 in locations corresponding to the dummy vias 116c. In particular, the openings 116c-O may be formed in the region R (e.g., see FIG. 1B) around an entire periphery of the interposer module 120, between the lower bonding pads 116a, between the metal interconnect structures 116b, and so as to have a centerline (e.g., in the x-direction) corresponding to an inner edge 150a of the stiffener ring 150. The openings 116c-O may also be formed so as to have a size (e.g., depth, diameter, length, width, etc.) and shape (e.g., circular cylinder, conical cylinder) corresponding to the size and shape of the dummy vias 116c. In particular, the distance D from the centerline of the openings 116c-O to an edge of the openings 116c-O may be greater than 0.1 mm and less than 2 mm. In addition, a depth of the openings 116c-O may be no greater than a total thickness of the package substrate lower dielectric layer 116. The openings 116c-O may be formed by using a photolithographic process. The photolithographic process may include forming a patterned photoresist mask (not shown) on an upper surface of the package substrate lower dielectric layer 116, and etching (e.g., wet etching, dry etching, etc.) the exposed upper surface through openings in the photoresist mask. The photoresist mask may be subsequently removed by ashing, dissolving the photoresist mask or by consuming the photoresist mask during the etch process.

Figure 2G:
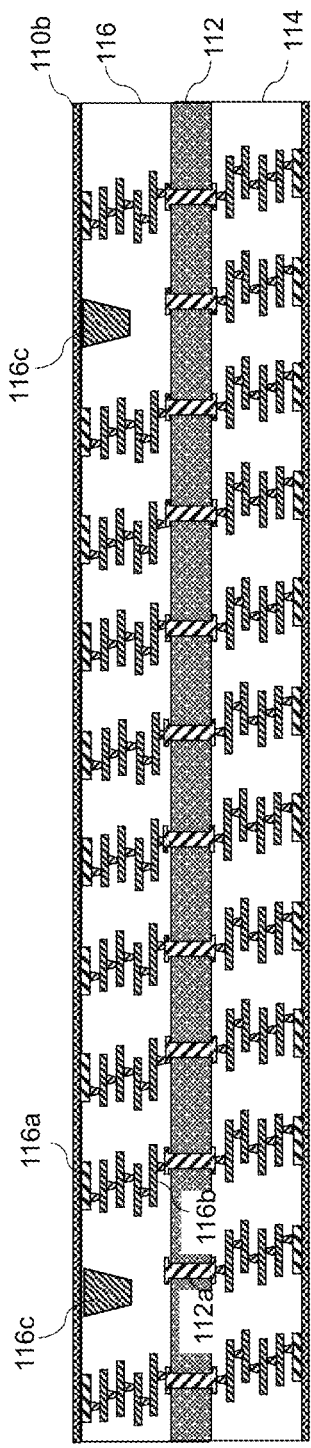
FIG. 2G is a vertical cross-sectional view of an intermediate structure including dummy vias according to one or more embodiments.

FIG. 2G is a vertical cross-sectional view of an intermediate structure including dummy vias 116c according to one or more embodiments. The dummy vias 116c may be formed, for example, by depositing a metal layer (e.g., copper, aluminum or other suitable conductive materials) in the openings 116c-O and on the upper surface of the package substrate lower dielectric layer 114 by CVD, PVD or other suitable deposition technique. The metal layer may then be etched (e.g., by wet etching, dry etching, etc.) so as to form the dummy vias 116.

The lower passivation layer 110b may then be formed on the upper surface of the package substrate lower dielectric layer 116. The lower passivation layer 110b may be formed so as to partially cover the package substrate lower bonding pads 116a. The lower passivation layer 110b may or may not cover the dummy vias 116c. The lower passivation layer 110b may be formed, for example, by chemical vapor deposition (CVD), physical vapor deposition (PVD), spin coating, lamination or other suitable deposition technique.

Figure 2H:
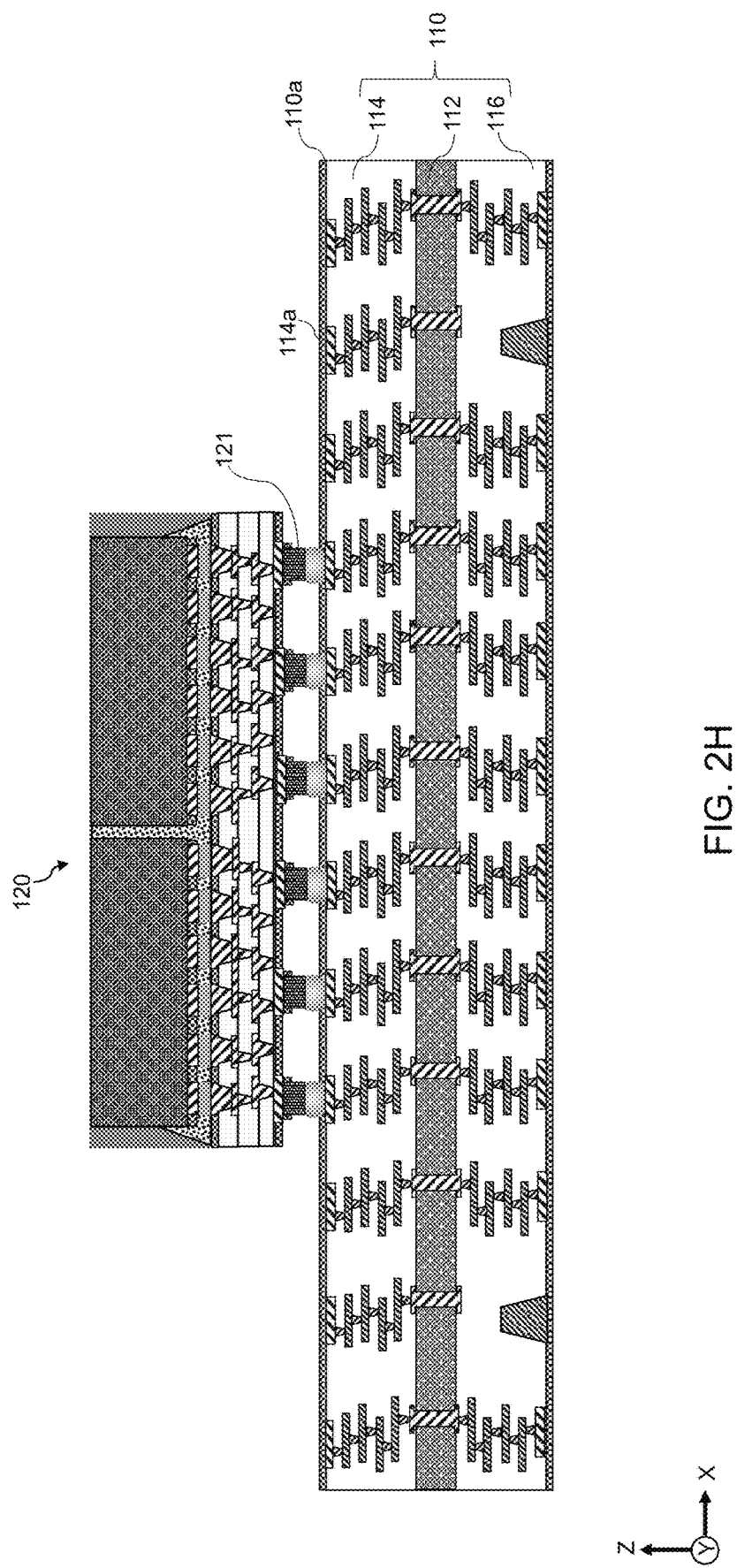
FIG. 2H illustrates a vertical cross-sectional view of an intermediate structure in which the interposer module may be mounted on the package substrate (e.g., via a flip chip bonding (FCB) process) according to one or more embodiments.

FIG. 2H illustrates a vertical cross-sectional view of an intermediate structure in which the interposer module 120 may be mounted on the package substrate 110 (e.g., via a flip chip bonding (FCB) process) according to one or more embodiments. As illustrated in FIG. 2A, a solder portion of the C4 bumps 121 of the interposer module 120 may be positioned on the package substrate upper bonding pads 114a on the package substrate 110. The intermediate structure may then be heated in order to bond the solder portion of the C4 bumps 121 to a part of the package substrate upper bonding pads 114a that is exposed through the upper passivation layer 110a.

Figure 2I:
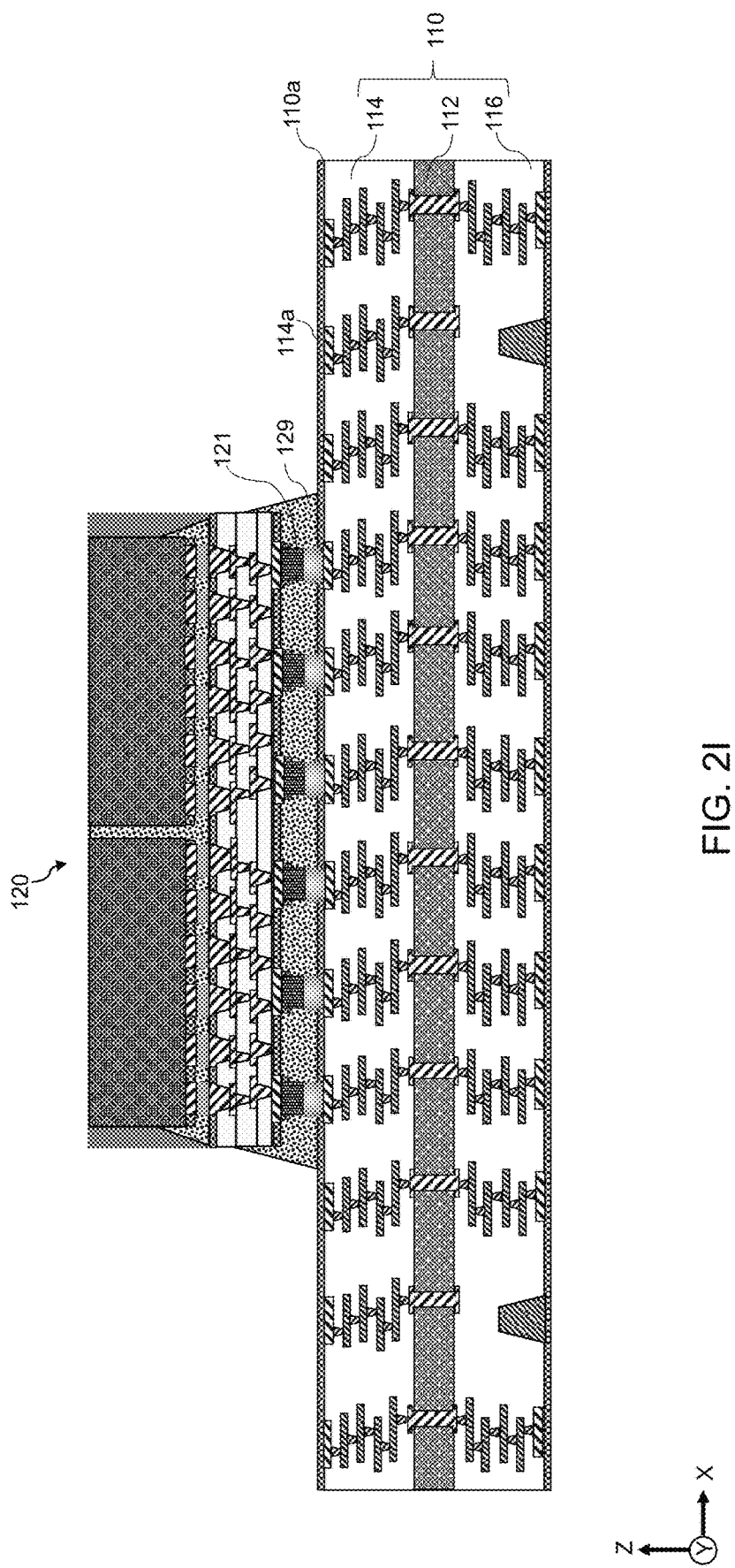
FIG. 2I illustrates a vertical cross-sectional view of an intermediate structure in which the package underfill layer may be formed on the package substrate according to one or more embodiments.

FIG. 2I illustrates a vertical cross-sectional view of an intermediate structure in which the package underfill layer 129 may be formed on the package substrate 110 according to one or more embodiments. The package underfill layer 129 may be formed of an epoxy-based polymeric material. As illustrated in FIG. 2I, the package underfill layer 129 may be formed under and around the interposer module 120 and the C4 bumps 121 so as to fix the interposer module 120 to the package substrate 110. The package underfill layer 129 may then be cured, for example, in a box oven for about 90 minutes at about 150° C. to provide the package underfill layer 129 with a sufficient stiffness and mechanical strength.

Figure 2J:
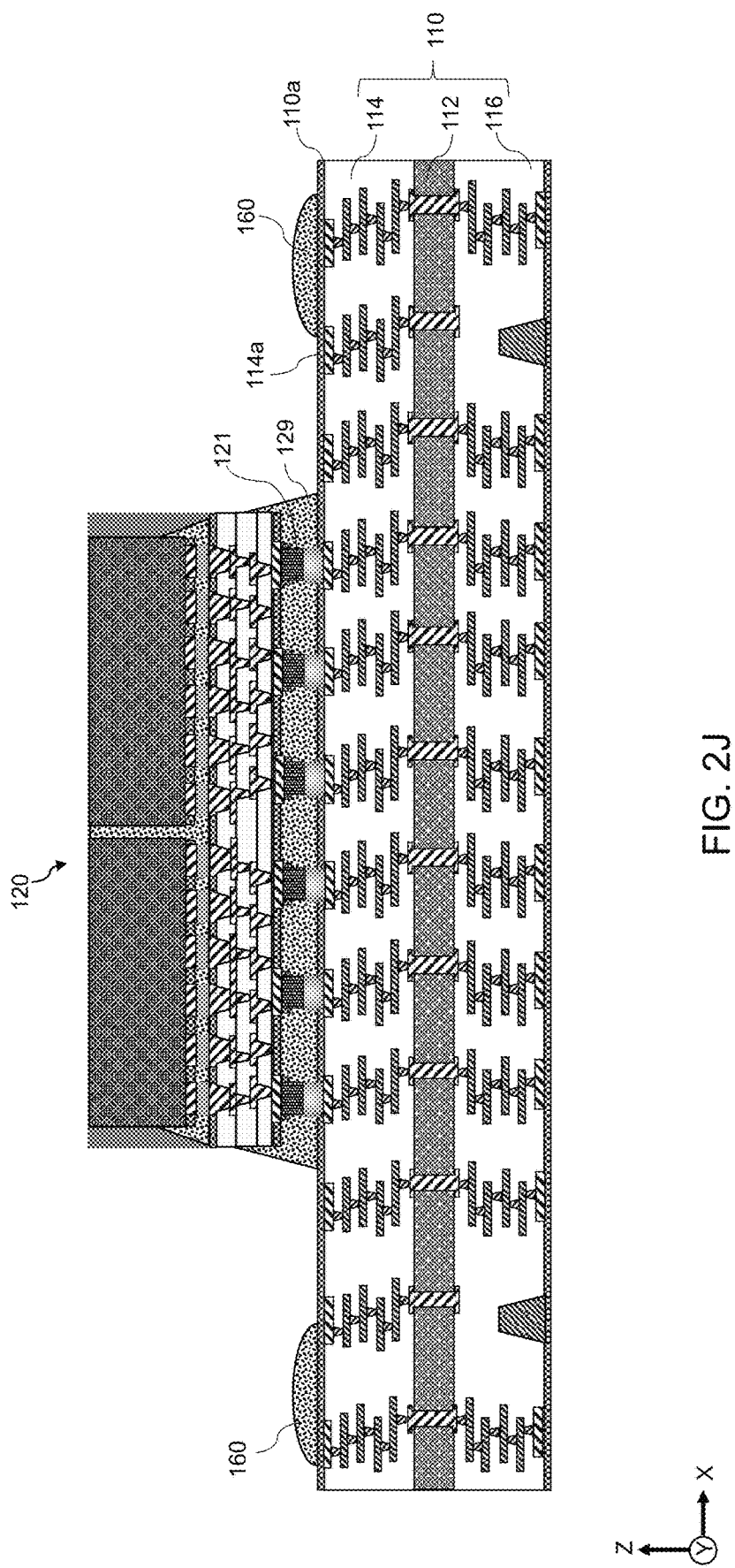
FIG. 2J illustrates a vertical cross-sectional view of an intermediate structure in which the adhesive may be applied to the package substrate according to one or more embodiments.

FIG. 2J illustrates a vertical cross-sectional view of an intermediate structure in which the adhesive 160 may be applied to the package substrate 110 according to one or more embodiments. The adhesive 160 may include, for example, a silicone adhesive or an epoxy adhesive. The adhesive 160 may be located on the package substrate 110 at a position corresponding to a placement of the stiffener ring 150. In particular, the adhesive 160 may be formed as a continuous bead around an entire periphery of the interposer module 120. The adhesive 160 may be dispensed on a surface of the package substrate 110 in a quantity sufficient to securely bond the stiffener ring 150 to the package substrate 110.

Figure 2K:
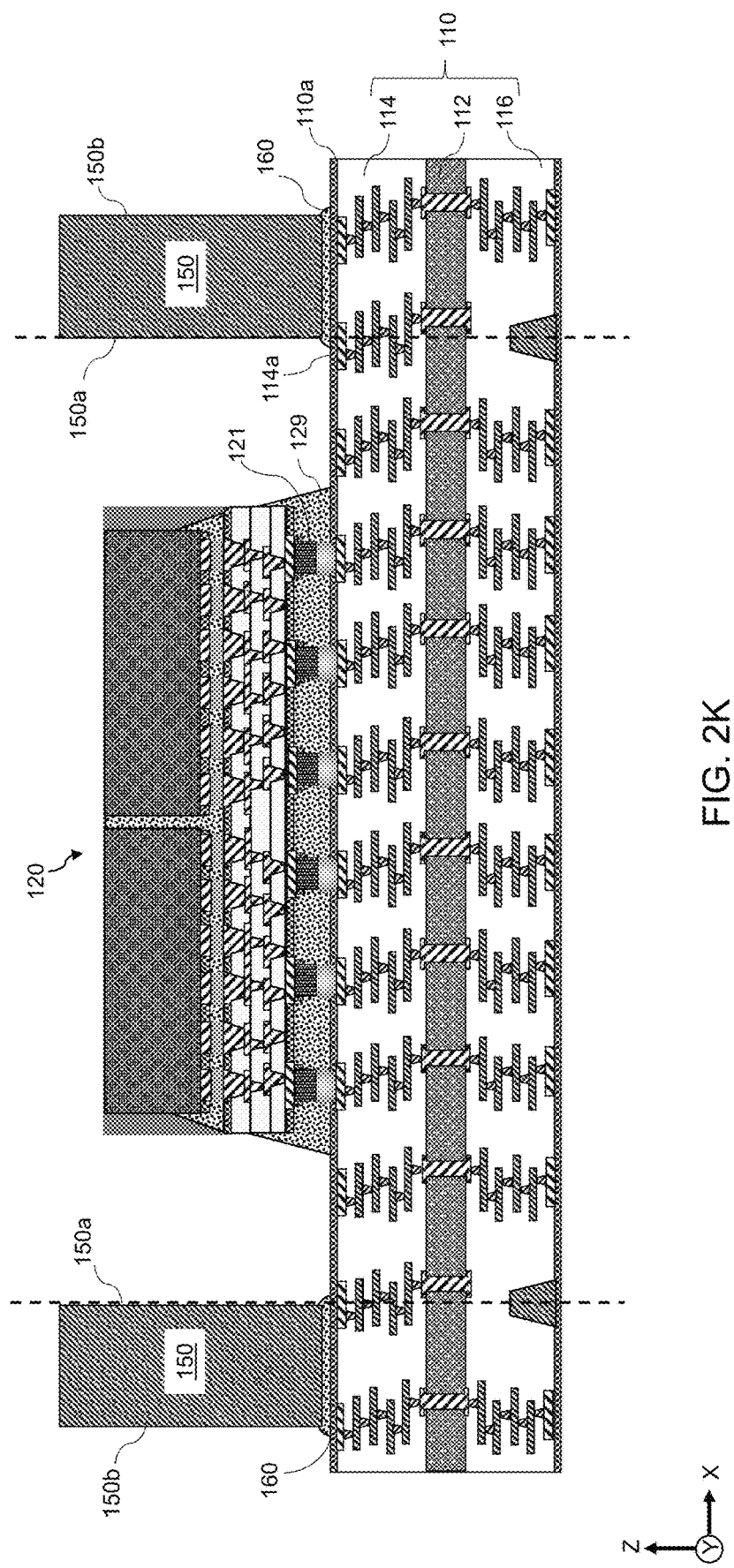
FIG. 2K illustrates a vertical cross-sectional view of an intermediate structure in which the stiffener ring may be attached to (e.g., mounted on) the package substrate according to one or more embodiments.

FIG. 2K illustrates a vertical cross-sectional view of an intermediate structure in which the stiffener ring 150 may be attached to (e.g., mounted on) the package substrate 110 according to one or more embodiments. The stiffener ring 150 may be composed of metal material (e.g., aluminum) and may be formed, for example, by milling using a computer numerical control (CNC) milling machine.

The package substrate 110 with the interposer module 120 may be placed on a surface and the stiffener ring 150 lowered down onto the package substrate 110 around the interposer module 120. The stiffener ring 150 may then be aligned with the adhesive 160 formed on the package substrate 110. The stiffener ring 150 may then be pressed downward by applying a pressing force down onto the stiffener ring 150 so that the stiffener ring 150 may be fixed to the package substrate 110 through the adhesive 160.

Alternatively, the stiffener ring 150 may be placed on a surface (e.g., a flat surface), and the package substrate 110 inverted and lowered onto the stiffener ring 150. That is, the interposer module 120 is inserted into the stiffener ring 150. The package substrate 110 and interposer module 120 may then be pressed by applying a pressing force down into stiffener ring 150 so that the stiffener ring 150 is fixed to the package substrate 110 through the adhesive 160.

The stiffener ring 150 may be clamped to the package substrate 110 for a period to allow the adhesive 160 to cure and form a secure bond between the package substrate 110 and the stiffener ring 150. The clamping of the stiffener ring 150 to the package substrate 110 may be performed, for example, by using a heat clamp module. The heat clamp module may apply a uniform force across the upper surface of the stiffener ring 150.

Figure 2L:
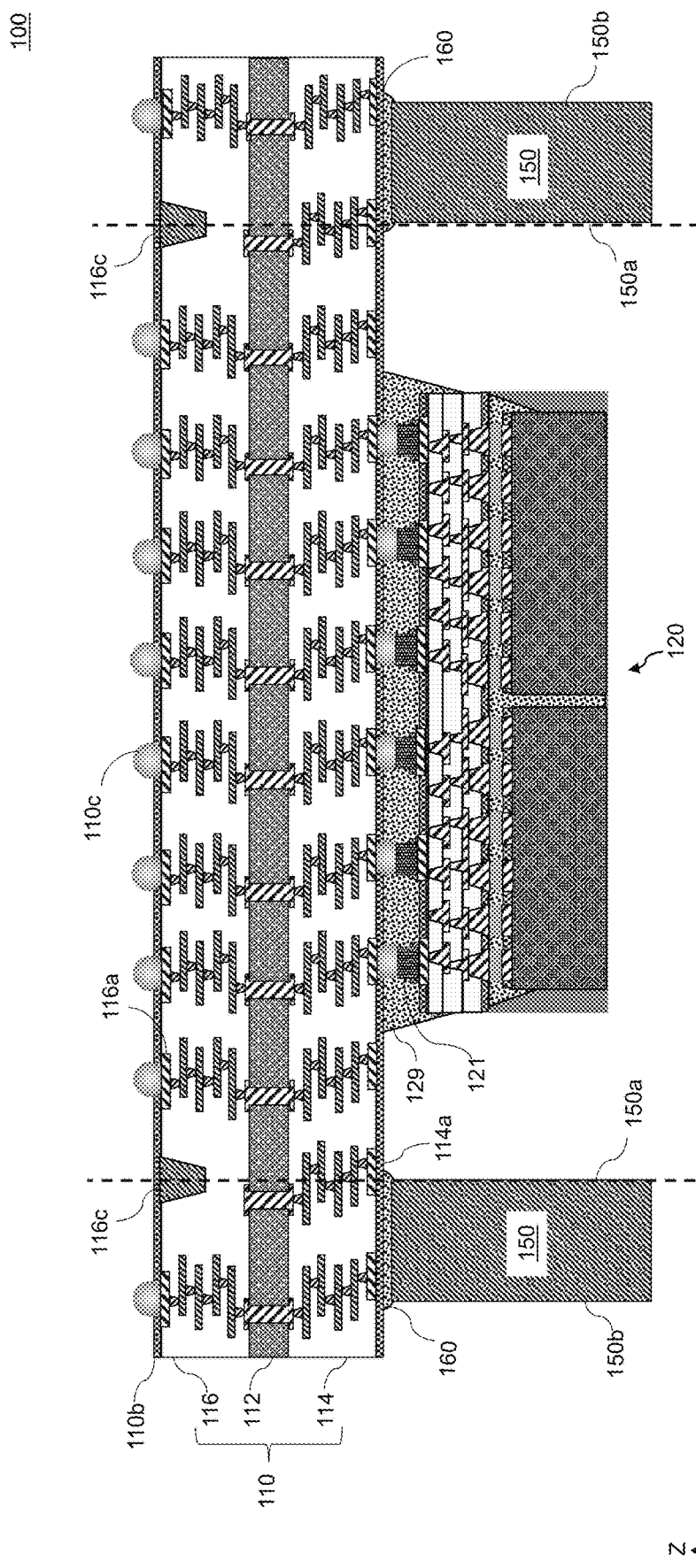
FIG. 2L illustrates a vertical cross-sectional view of an intermediate structure in which a plurality of solder balls may be formed on the package substrate according to one or more embodiments.

FIG. 2L illustrates a vertical cross-sectional view of an intermediate structure in which a plurality of solder balls 110c may be formed on the package substrate 110 according to one or more embodiments. The plurality of solder balls 110c may be formed on the lower bonding pads 116a, for example, by an electroplating process. The plurality of solder balls 110c may contact the lower bonding pads 116a through openings in the lower passivation layer 110b. The plurality of solder balls 110c may constitute a ball-grid array (BGA) that may allow the semiconductor package 100 to be securely mounted (e.g., by surface mount technology (SMT)) on a substrate such as a printed circuit board and electrically coupled to the substrate.

The solder balls 110c may be formed, for example, so as to be located under the stiffener ring 150 and under the interposer module 120, and so as to be located adjacent to the dummy vias 116c. In particular, the solder balls 110c located under the interposer module 120 and solder balls 110c under the stiffener ring 150 may be located on opposing sides of the dummy vias 116c.

Figure 3:
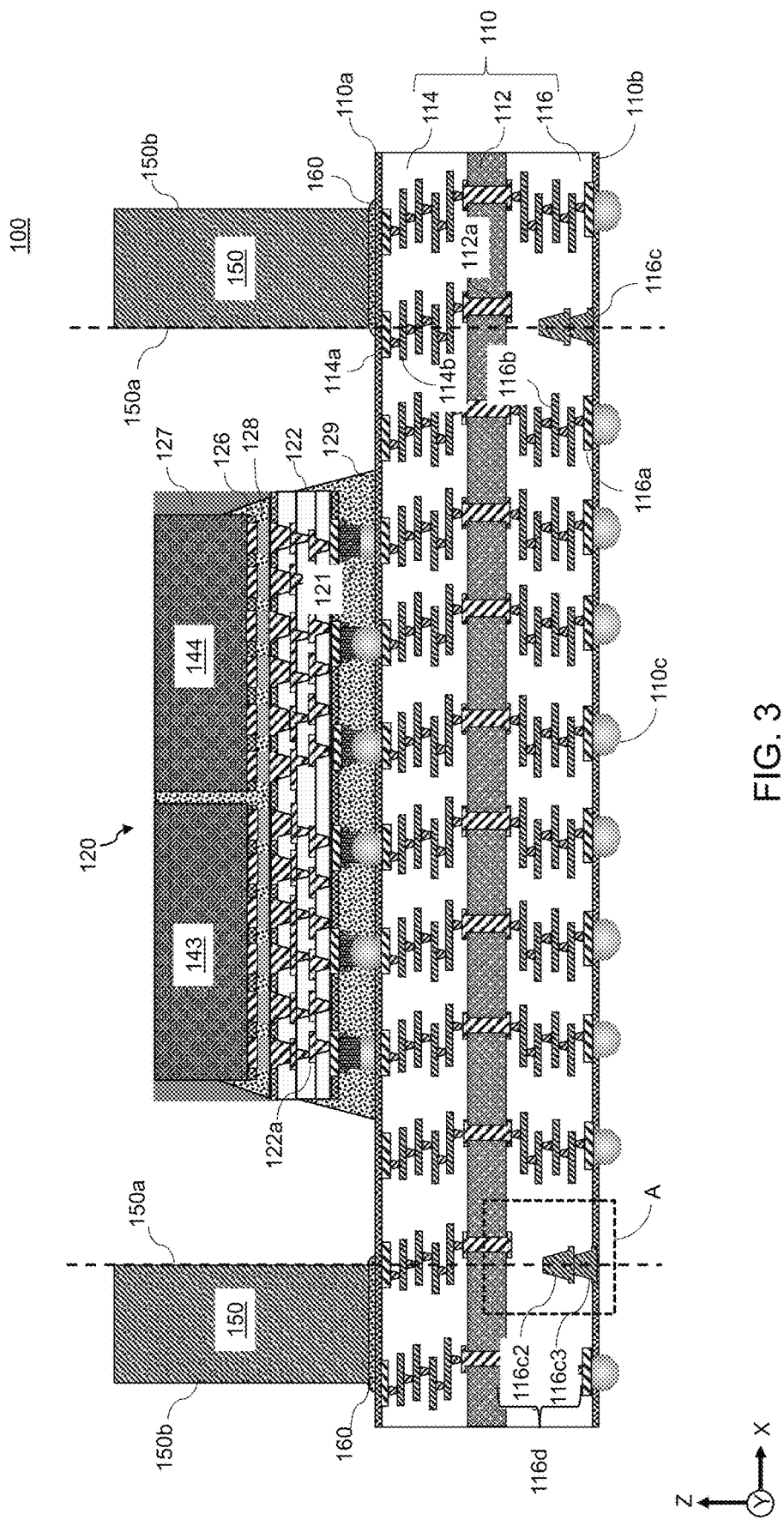
FIG. 3 illustrates a vertical cross-sectional view of a first alternative design of the semiconductor package, according to one or more embodiments.

FIG. 3 illustrates a vertical cross-sectional view of a first alternative design of the semiconductor package 100, according to one or more embodiments. As illustrated in FIG. 3, the first alternative design may include stacked dummy vias 116d. Each stacked dummy via 116d may include a dummy via layer 116c2 and a dummy via layer 116c3 stacked on the dummy via layer 116c2. It should be noted that although two dummy via layers are illustrated in FIG. 3, the stacked dummy vias 116d in the first alternative design may include any number of stacked dummy via layers.

The stacked dummy vias 116d may be substantially similar to the dummy vias 116c described above. In particular, the stacked dummy vias 116d may have a structure (e.g., size and shape) and function that are substantially similar to the structure and function of the dummy vias 116c described above (e.g., see FIG. 1A). The stacked dummy vias 116d may also have an arrangement (e.g., layout) that is substantially similar to the arrangement of the dummy vias 116c described above (e.g., see FIG. 1B).

An advantage of the first alternative design in FIG. 3 is that the stacked dummy vias 116d may be formed during a formation of the package substrate lower dielectric layer 116. This may result in fewer overall processing steps. The stacked dummy vias 116d may be formed in the same dielectric layers and using the same materials that are used in forming the metal interconnect structures 116b. A thickness of each of the dummy via layers (e.g., dummy via layer 116c2 and a dummy via layer 116c3) may be substantially the same as a thickness of the dielectric layer in which the dummy via layer (e.g., dummy via layer 116c2, dummy via layer 116c3) is formed.

FIGS. 4A-4D illustrate a method of forming the stacked dummy via 116d in the first alternative design, according to one or more embodiments. In particular, FIGS. 4A-4D illustrate a detailed view of the Region A in FIG. 3.

Figure 4A:
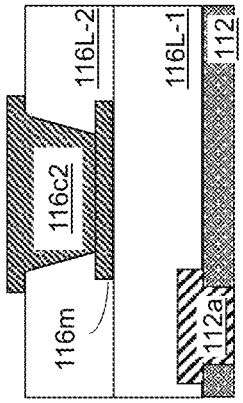
FIG. 4A illustrates a vertical cross-sectional view of an intermediate structure in which an opening has been formed according to one or more embodiments.

FIG. 4A illustrates a vertical cross-sectional view of an intermediate structure in which an opening 116c-O2 has been formed according to one or more embodiments. As illustrated in FIG. 4A, a first dielectric layer 116L-1 of the package substrate lower dielectric layer 116 may be formed on the core 112 by any suitable deposition method (e.g., CVD, PVD, etc.). A metal material (e.g., metal trace) may be formed on the first dielectric layer 116L-1 by any suitable deposition method (e.g., CVD, PVD, etc.) and patterned by a photolithographic process to form the metal layer 116m. The metal layer 116m may be formed concurrently with the forming of a metal layer (e.g., metal trace) of the metal interconnect structures 116*b*, and using the using the same metal material as the metal interconnect structures 116*b*.

A second dielectric layer 116L-2 of the package substrate lower dielectric layer 116 may then be formed on the first dielectric layer 116L-1 by any suitable deposition method (e.g., CVD, PVD, etc.). The opening 116*c*-O2 may then be formed in the second dielectric layer 116L-2, for example, by etching (e.g., wet etching, dry etching, etc.). The metal layer 116*m* may serve as an etch stop layer in the etching of the opening 116*c*-O2.

Figure 4B:
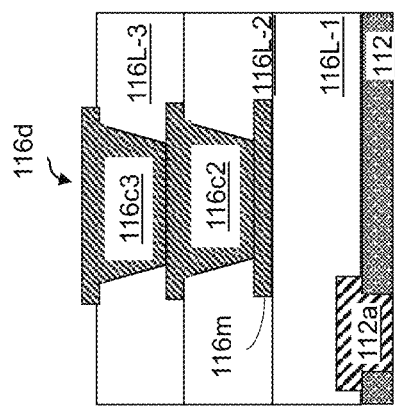
FIG. 4B illustrates a vertical cross-sectional view of an intermediate structure in which dummy via layer has been formed according to one or more embodiments.

FIG. 4B illustrates a vertical cross-sectional view of an intermediate structure in which dummy via layer 116*c*2 has been formed according to one or more embodiments. As illustrated in FIG. 4B, the dummy via layer 116*c*2 may be formed in the opening 116*c*-O2 and on the metal layer 116*m*. The dummy via layer 116*c*2 may be formed concurrently with the forming of a metal layer (e.g., metal via) of the metal interconnect structures 116*b*, and using the using the same metal material as the metal interconnect structures 116*b*.

Figure 4C:
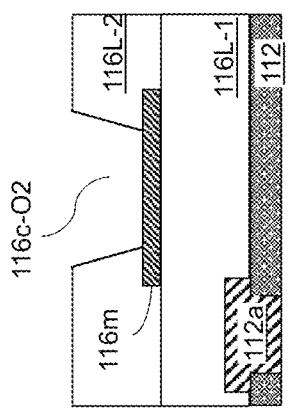
FIG. 4C illustrates a vertical cross-sectional view of an intermediate structure in which an opening has been formed according to one or more embodiments.

FIG. 4C illustrates a vertical cross-sectional view of an intermediate structure in which an opening 116*c*-O3 has been formed according to one or more embodiments. As illustrated in FIG. 4C, a third dielectric layer 116L-3 of the package substrate lower dielectric layer 116 may be formed on the second dielectric layer 116L-2 by any suitable deposition method (e.g., CVD, PVD, etc.). The opening 116*c*-O3 may then be formed in the third dielectric layer 116L-3, for example, by etching (e.g., wet etching, dry etching, etc.).

Figure 4D:
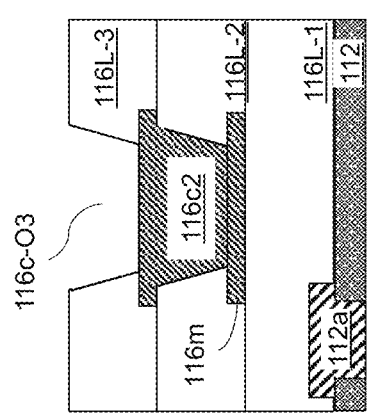
FIG. 4D illustrates a vertical cross-sectional view of an intermediate structure in which dummy via layer has been formed according to one or more embodiments.

FIG. 4D illustrates a vertical cross-sectional view of an intermediate structure in which dummy via layer 116*c*3 has been formed according to one or more embodiments. As illustrated in FIG. 4D, the dummy via layer 116*c*3 may be formed in the opening 116*c*-O3 and on the dummy via layer 116*c*2. The dummy via layer 116*c*3 may be formed concurrently with the forming of a metal layer (e.g., metal trace) of the metal interconnect structures 116*b*, and using the using the same metal material as the metal interconnect structures 116*b*.

Figure 5:
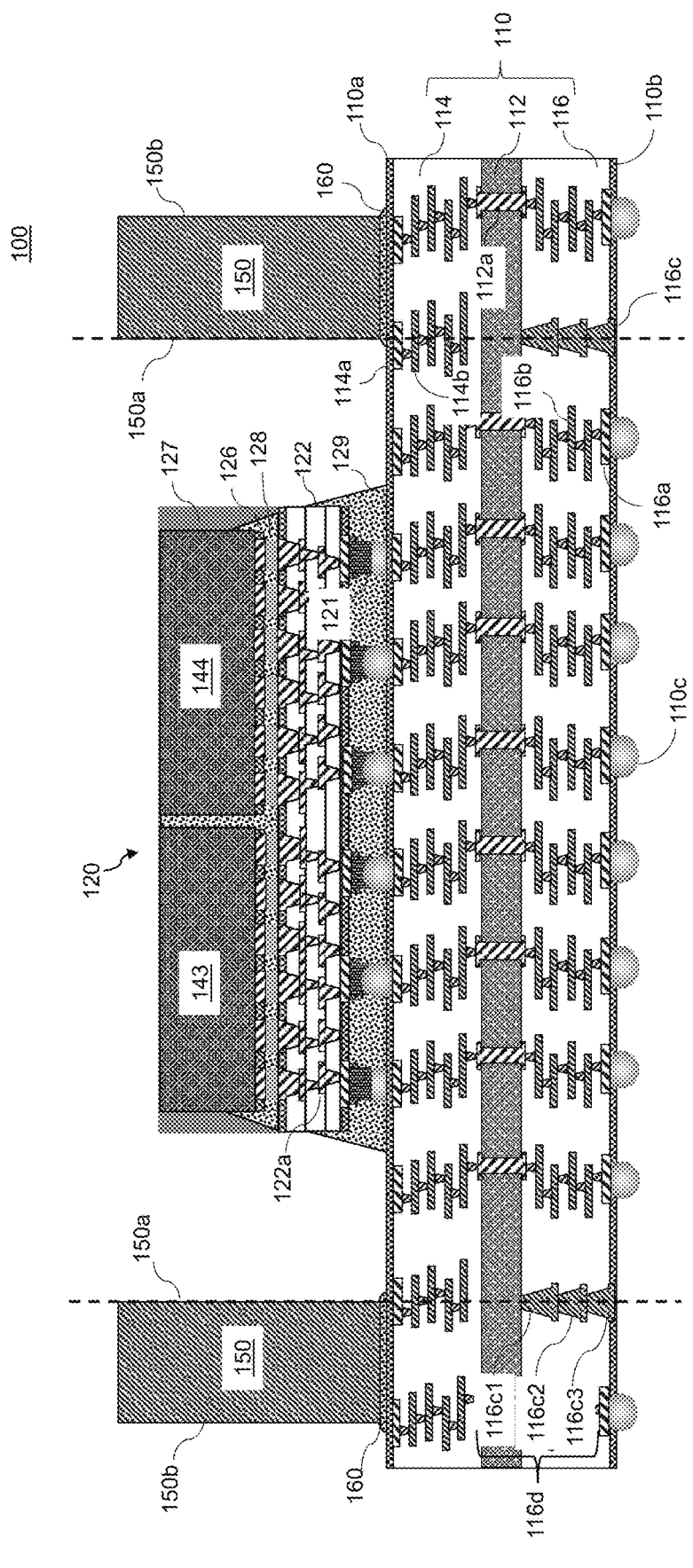
FIG. 5 illustrates a vertical cross-sectional view of a second alternative design of the semiconductor package, according to one or more embodiments.

FIG. 5 illustrates a vertical cross-sectional view of a second alternative design of the semiconductor package 100, according to one or more embodiments. As with the first alternative design in FIG. 3, the second alternative design may include stacked dummy vias 116*d*. However, in the second alternative design, each stacked dummy via 116*d* may include a dummy via layer 116*c*1, dummy via layer 116*c*2 stacked on the dummy via layer 116*c*1, and dummy via layer 116*c*3 stacked on the dummy via layer 116*c*2.

As illustrated in FIG. 5, the stacked dummy vias 116*d* in FIG. 5 may have a thickness that is substantially the same as a thickness of the package substrate lower dielectric layer 116. The dummy via layer 116*c*1 may be formed on the core 112 or on a metal layer on a surface of the core 112. Further, in the alternative design (as in all of the embodiments of the semiconductor package 100), the core 112 may be formed so as to accommodate the stacked dummy vias 116*d*. In particular, the through vias 112*a* may be formed outside the region for forming the stacked dummy vias 116*d* so as not to interfere with the formation of the stacked dummy vias 116*d*.

The stacked dummy vias 116*d* in the second alternative design may be formed by a method that is substantially the same as the method described above with respect to FIGS. 4A-4D. That is, each of the dummy via layer 116*c*1, dummy via layer 116*c*2 and dummy via layer 116*c*3 may be formed in different dielectric layers of package substrate lower dielectric layer 116. In particular, the dummy via layer 116*c*1, dummy via layer 116*c*2 and dummy via layer 116*c*3 may be formed concurrently with the forming of a metal layer (e.g., metal trace) of the metal interconnect structures 116*b*, and using the using the same metal material as the metal interconnect structures 116*b*.

Figure 6A:
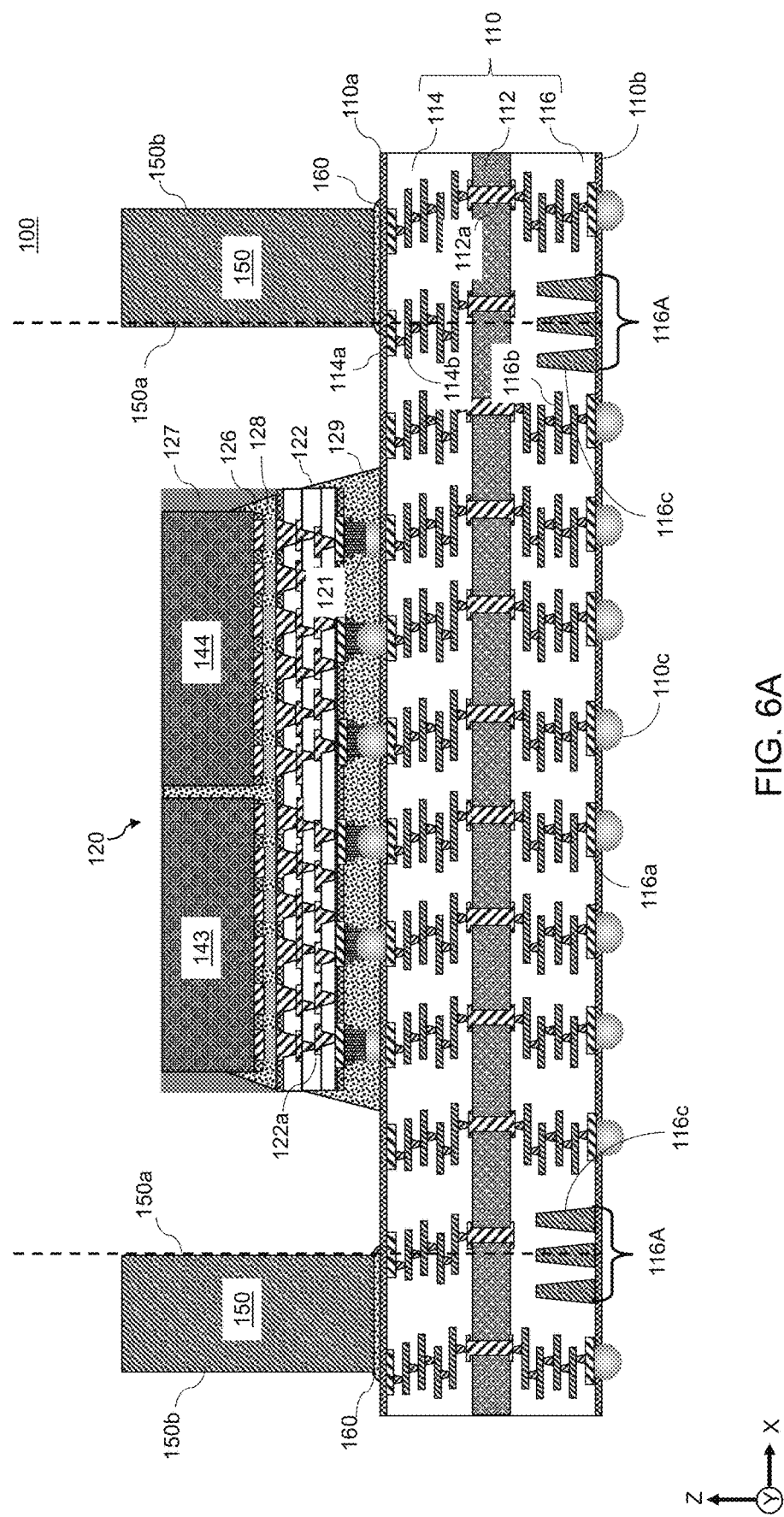
FIG. 6A illustrates a vertical cross-sectional view of a third alternative design of the semiconductor package, according to one or more embodiments.

FIG. 6A illustrates a vertical cross-sectional view of a third alternative design of the semiconductor package 100, according to one or more embodiments. As illustrated in FIG. 6A, the third alternative design may include a dummy via array 116A including a plurality of dummy vias 116*c*. The dummy vias 116*c* in the dummy via array 116A may be arranged, for example, in columns and rows around the entire periphery of the interposer module. For example, in FIG. 6A, the dummy via array 116A may include rows of dummy vias 116*c* aligned in the x-direction, and three columns of the dummy vias 116*c* in the y-direction (e.g., into the page). A centerline of the dummy via array 116A may be substantially aligned with the inner edge 150*a* of the stiffener ring. For example, in FIG. 6A, the centerline of the dummy via array 116A may be coincident with the middle column of dummy vias 116*c* in the dummy via array 116A.

Figure 6B:
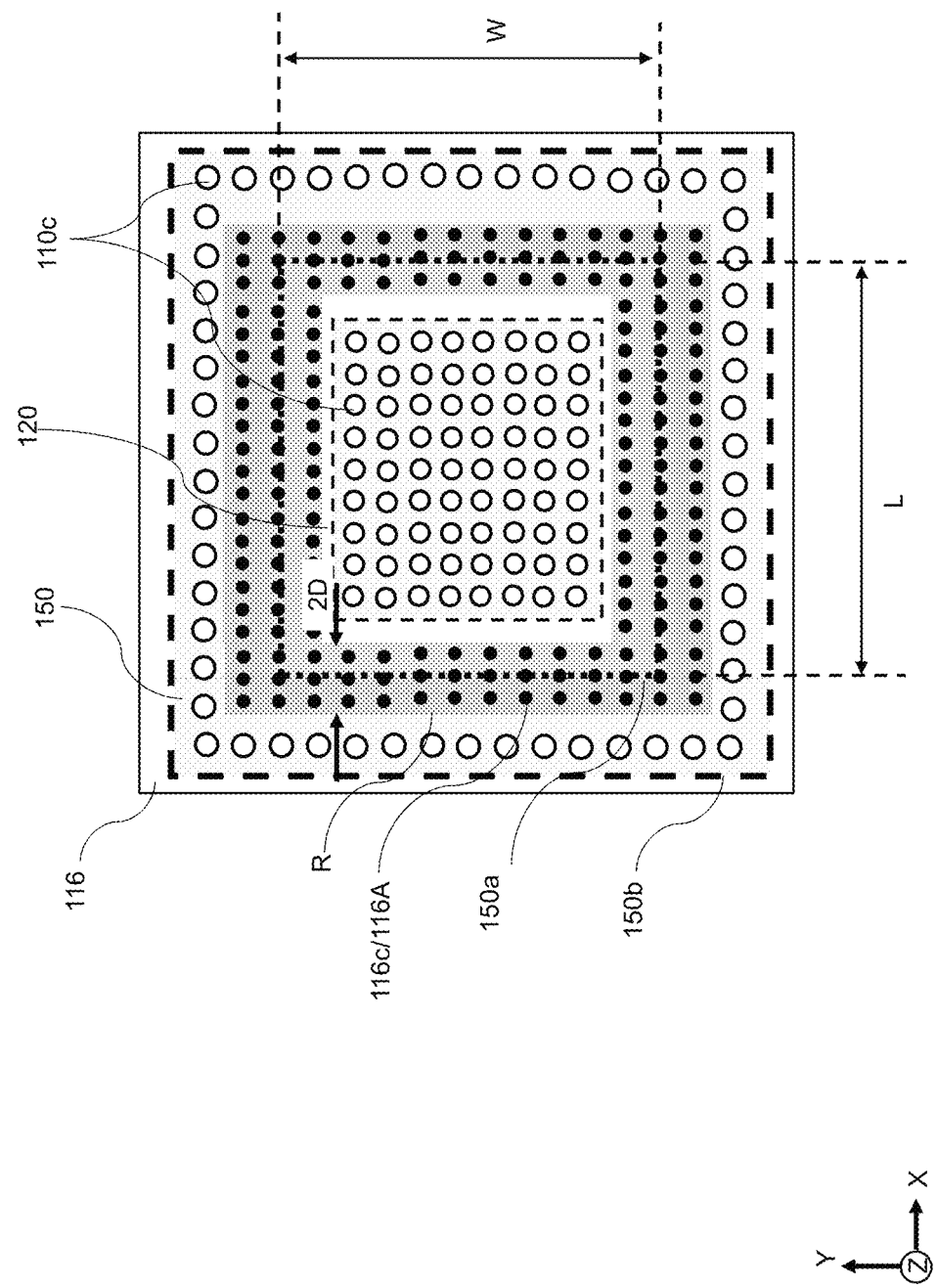
FIG. 6B is a plan view of the board-side surface of package substrate lower dielectric layer for the third alternative design of the semiconductor package, according to one or more embodiments.

FIG. 6B is a plan view of the board-side surface of package substrate lower dielectric layer 116 for the third alternative design of the semiconductor package 100, according to one or more embodiments. A location of the stiffener ring 150 and the interposer module 120 on the opposing surface (e.g., chip-side surface) of the package substrate 110 is indicated by shading. The outer periphery of the interposer module 120 and the inner edge 150*a* and outer edge 150*b* of the stiffener ring 150 are also indicated by a dashed line in FIG. 6B.

As illustrated in FIG. 6B, a layout of the dummy via array 116A may be substantially similar to the layout of the dummy vias 116*c* in FIG. 1B. The dummy via array 116A may be located adjacent to solder balls 110*c* of the BGA. In particular, the dummy via array 116A may be formed between the inner set of solder balls 110*c* under the interposer module 120, and the outer set of solder balls 110*c* under the stiffener ring 150.

The dummy via array 116A may be formed around an entire periphery of the interposer module 120 in the plan view. The inner edge 150*a* may have a length L in the x-direction and a width W in the y-direction. Therefore, a total length of the inner edge 150*a* may be given by 2(L+W).

In particular, the dummy via array 116A may be formed under the inner edge 150*a* of the stiffener ring 150 over the entire length of the inner edge 150*a*. The dummy via array 116A may be substantially aligned under the inner edge 150*a* of the stiffener ring 150. Thus, in a plan view the dummy via array 116A may be arranged so as to have a ring shape substantially the same as a ring shape of the stiffener ring 150.

As illustrated in FIG. 6B, the dummy vias 116*c* in the dummy via array 116A may extend away from the centerline by a distance D. Thus, a width (e.g., diameter) of the dummy via array 116A in the x-direction and y-direction may be 2D. In at least one embodiment, the distance D from the centerline of the dummy via array 116A to an edge of the dummy via array 116A may be greater than 0.1 mm and less than 2 mm.

The dummy via array 116A may be located in a region R having a width that is substantially the same as the width (2D) of the dummy via array 116A. As with the dummy vias 116*c* in FIG. 1B, the area ratio Ra for the dummy vias 116*c* in the dummy via array 116A may be, for example, greater than 0.1 and less than 0.9.

Figure 7:
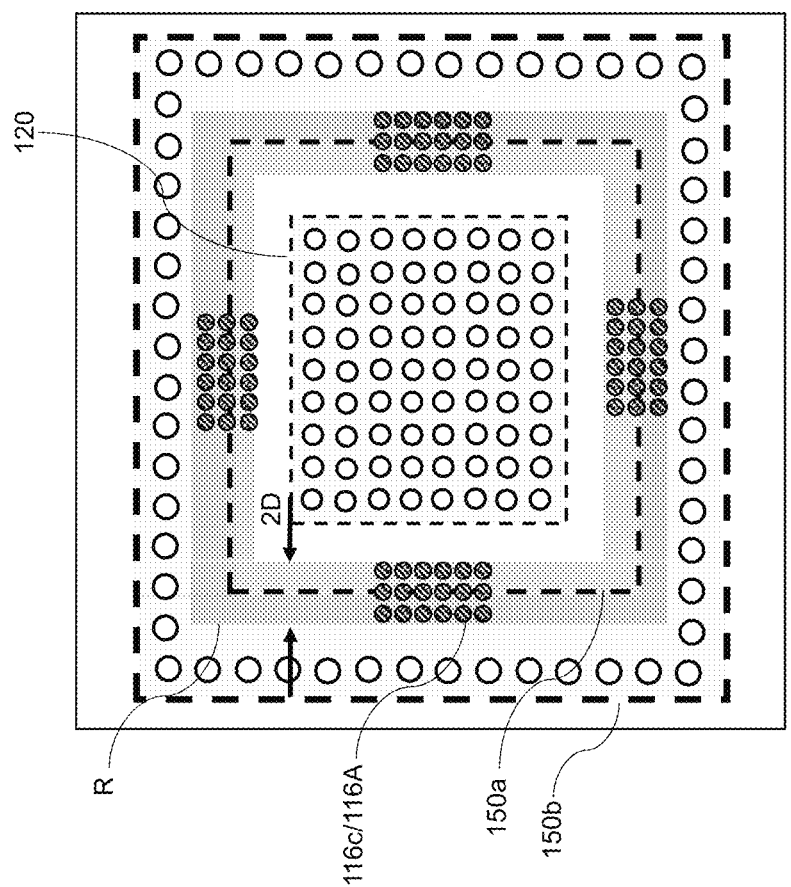
FIG. 7 is a plan view of the board-side surface of package substrate lower dielectric layer for a fourth alternative design of the semiconductor package, according to one or more embodiments.

FIG. 7 is a plan view of the board-side surface of package substrate lower dielectric layer 116 for a fourth alternative design of the semiconductor package 100, according to one or more embodiments. The fourth alternative design may be substantially similar to the third alternative design in FIGS. 6A-6B. However, in the fourth alternative design, the dummy via array 116A is not necessarily formed continuously around the inner edge 150a of the stiffener ring 150. Instead, there may be portions of the region R around the inner edge 150a where the dummy vias 116c are not formed. It should be noted that the configuration of the dummy via array 116A in FIG. 7 is not limiting, but there may be other configurations of the dummy via array 116A. For example, there may be groups of dummy vias 116c formed at one or more corners of the stiffener ring 150, on one or more sides of the stiffener ring 150, and so on. Further, the groups of dummy vias 116c in the dummy via array 116A may be formed in two columns, four columns, and so on.

Figure 8A:
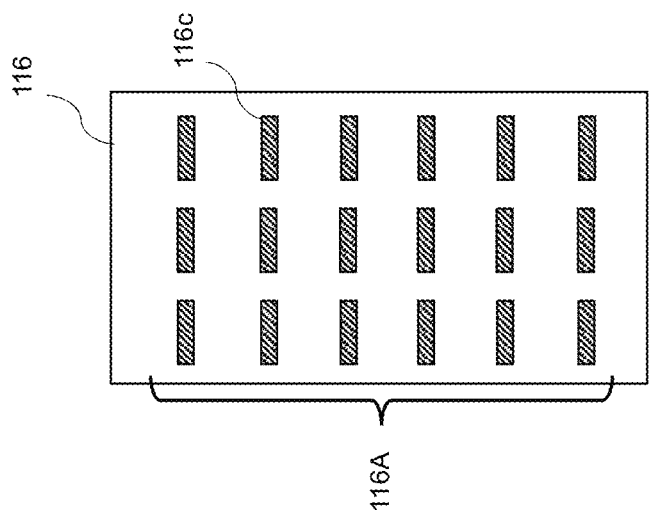
FIG. 8A illustrates the dummy vias having a line shaped cross-section (e.g., looking down onto the board-side surface of the package substrate lower dielectric layer), according to one or more embodiments.
Figure 8B:
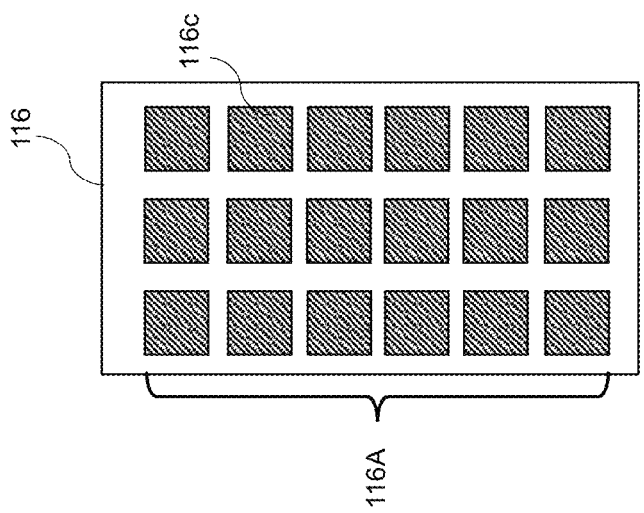
FIG. 8B illustrates the dummy vias having a rectangular shaped cross-section (e.g., square shaped), according to one or more embodiments.
Figure 8C:
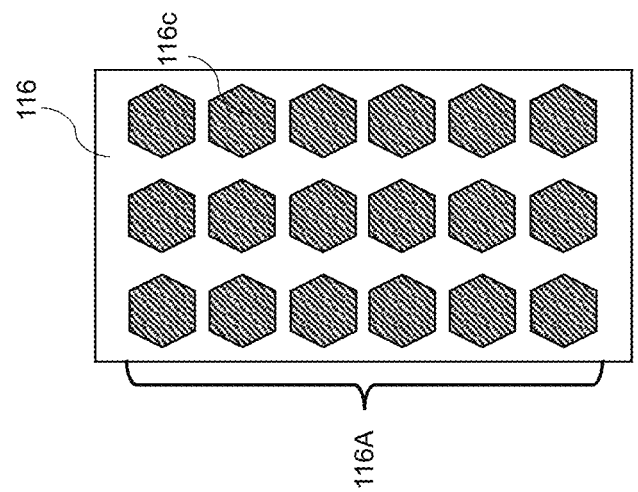
FIG. 8C illustrates the dummy vias having a hexagonal shaped cross-section, according to one or more embodiments.

FIGS. 8A-8C illustrate alternative shapes (e.g., cross-sectional shapes) of the of the dummy vias 116c in the dummy via array 116A, according to one or more embodiments. It should be noted that the alternative shapes in FIGS. 8A-8C may also be applied to the dummy vias 116c in other embodiments (e.g., FIGS. 1A-1B). In addition, the alternative shapes in FIGS. 8A-8C are not intended to be limiting so that other shapes for the dummy vias 116c may be within the scope of this disclosure. In addition, the dummy vias 116c are not required to have one uniform shape, but may have two more different shapes in the semiconductor package 100.

In particular, FIG. 8A illustrates the dummy vias 116c having a line shaped cross-section (e.g., looking down onto the board-side surface of the package substrate lower dielectric layer 116), according to one or more embodiments. The line shape may be arranged so as to have a longitudinal direction in the x-direction and/or y-direction. FIG. 8B illustrates the dummy vias 116c having a rectangular shaped cross-section (e.g., square shaped), according to one or more embodiments. FIG. 8C illustrates the dummy vias 116c having a hexagonal shaped cross-section, according to one or more embodiments.

Figure 9:
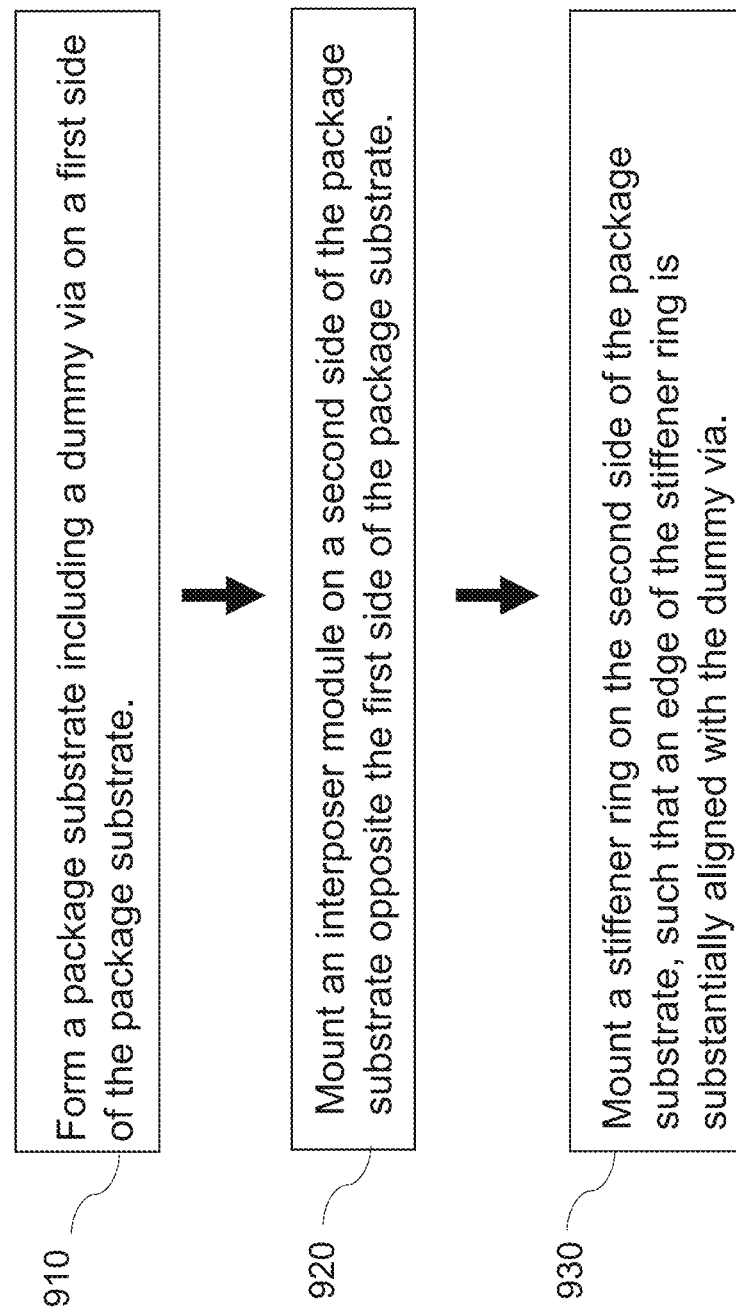
FIG. 9 is a flow chart illustrating a method of making a semiconductor package according to one or more embodiments.

FIG. 9 is a flow chart illustrating a method of making a semiconductor package according to one or more embodiments. Step 910 includes forming a package substrate including a dummy via on a first side of the package substrate. Step 920 includes mounting an interposer module on a second side of the package substrate opposite the first side of the package substrate. Step 930 includes mounting a stiffener ring on the second side of the package substrate, such that an edge of the stiffener ring is substantially aligned with the dummy via.

Referring to FIGS. 1A-9, a semiconductor package 100 may include a package substrate 110 including a dummy via 116c on a first side of the package substrate 110, an interposer module on a second side of the package substrate 110 opposite the first side of the package substrate 110, and a stiffener ring 150 on the second side of the package substrate 110 and including an edge that is substantially aligned with the dummy via 116c. In one embodiment, the dummy via 116c may include a plurality of dummy vias 116c constituting a dummy via array 116A. In one embodiment, the centerline of the dummy via array 116A may be substantially aligned with the edge of the stiffener ring 150. In one embodiment, the distance from the centerline of the dummy via array 116A to an edge of the dummy via array 116A may be greater than 0.1 mm and less than 2 mm. In one embodiment, the ratio $R_a$ of an area of the dummy via array 116A to an area of a region of the package substrate 110 including the dummy array via is greater than 0.1 and less than 0.9. In one embodiment, the plan view the dummy via array 116A may include a ring shape substantially the same as a ring shape of the stiffener ring 150. In one embodiment, the package substrate 110 may include a core 112, a package substrate upper dielectric layer 114 on the core and on the first side of the package substrate 110, and a package substrate lower dielectric layer 116 on the core and on the second side of the package substrate 110, wherein the dummy via 116c is located in the package substrate lower dielectric layer 116. In one embodiment, the height of the dummy via 116c may be less than a thickness of the package substrate lower dielectric layer 116. In one embodiment, the semiconductor package 100 may further include a ball grid array on the second side of the package substrate 110, wherein the dummy via 116c is located adjacent to the ball grid array. In one embodiment, the dummy via 116c may include a plurality of stacked dummy via layers 116c1, 116c2, 116c3. A shape of a cross-section of the dummy via 116c may include a circular shape, a rectangular shape or a hexagonal shape. In one embodiment, the edge of the stiffener ring 150 may include an inner edge of the stiffener ring 150, and the dummy via 116c may be located between the interposer module and the stiffener ring 150 in a plan view.

Referring to FIGS. 1A-9, a method of forming a semiconductor package 100 may include forming a package substrate 110 including a dummy via 116c on a first side of the package substrate 110, mounting an interposer module on a second side of the package substrate 110 opposite the first side of the package substrate 110, and mounting a stiffener ring 150 on the second side of the package substrate 110, such that an edge of the stiffener ring 150 is substantially aligned with the dummy via 116c. In one embodiment, the forming of the dummy via 116c may include forming a plurality of dummy vias 116c constituting a dummy via array 116A. In one embodiment, the forming of the plurality of dummy vias 116c may include substantially aligning a centerline of the dummy via array 116A with the edge of the stiffener ring 150. In one embodiment, the substantially aligning of the centerline of the dummy via array 116A may include locating the centerline of the dummy via array 116A such that a distance from the centerline to an edge of the dummy via array 116A is greater than 0.1 mm and less than 2 mm. In one embodiment, the forming of the plurality of dummy vias 116c may include forming the plurality of dummy vias 116c such that a ratio $R_a$ of an area of the dummy via array 116A to an area of a region R of the package substrate 110 may include the dummy array via is greater than 0.1 and less than 0.9. In one embodiment, the forming of the package substrate 110 may include forming a core, forming a package substrate upper dielectric layer 114 on the core 112 and on the first side of the package substrate 110, forming a package substrate lower dielectric layer on the core 112 and on the second side of the package substrate 110, and forming the dummy via 116c in the package substrate lower dielectric layer. In one embodiment, the method may further include forming a ball grid array on the first side of the package substrate lower dielectric layer such that the dummy via 116c is located adjacent to the ball grid array.

Referring to FIGS. 1A-9, a semiconductor package 100 may include a substrate 110 including a core 112 including a plurality of vias 112a, an upper dielectric layer 114 on the core 112 and on the first side of the substrate 110, and may include a plurality of upper metal interconnect structures 114b, a lower dielectric layer 116 on the core 112 and on the second side of the substrate 110, and may include a plurality of lower metal interconnect structures 116b electrically coupled to the plurality of upper metal interconnects 114b by the plurality of vias 112a, and a dummy via array 116A located in the lower dielectric layer 116 adjacent to the plurality of lower metal interconnect structures 116b. The semiconductor package 100 may further include an interposer module 120 on a second side of the substrate 110 opposite the first side of the substrate 110, a stiffener ring 150 on the second side of the substrate 110 and including an edge that is substantially aligned with a centerline of the dummy via array 116A, wherein a distance from the centerline of the dummy via array 116A to an edge of the dummy via array 116A is greater than 0.1 mm and less than 2 mm, and wherein a height of the dummy via array 116A is less than a thickness of the lower dielectric layer 116, and a ball grid array on a bottom surface of the lower dielectric layer 116 of the substrate 110, wherein the dummy via array 116A is located adjacent to the ball grid array in the bottom surface of the lower dielectric layer 116 of the substrate 110.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package comprising:
    a package substrate comprising a dummy via on a first side of the package substrate;
    an interposer module on a second side of the package substrate opposite the first side of the package substrate; and
    a stiffener ring on the second side of the package substrate and including an edge that is substantially aligned with the dummy via.

2. The semiconductor package of claim 1, wherein the dummy via comprises a plurality of dummy vias constituting a dummy via array.

3. The semiconductor package of claim 2, wherein a centerline of the dummy via array is substantially aligned with the edge of the stiffener ring.

4. The semiconductor package of claim 3, wherein a distance from the centerline of the dummy via array to an edge of the dummy via array is greater than 0.1 mm and less than 2 mm.

5. The semiconductor package of claim 2, wherein a ratio of an area of the dummy via array to an area of a region of the package substrate including the dummy via array is greater than 0.1 and less than 0.9.

6. The semiconductor package of claim 2, wherein in a plan view the dummy via array comprises a ring shape substantially the same as a ring shape of the stiffener ring.

7. The semiconductor package of claim 1, wherein the package substrate comprises:
    a core;
    a package substrate upper dielectric layer on the core and on the first side of the package substrate; and
    a package substrate lower dielectric layer on the core and on the second side of the package substrate, wherein the dummy via is located in the package substrate lower dielectric layer.

8. The semiconductor package of claim 7, wherein a height of the dummy via is less than a thickness of the package substrate lower dielectric layer.

9. The semiconductor package of claim 1, further comprising:
    a ball grid array on the second side of the package substrate, wherein the dummy via is located adjacent to the ball grid array.

10. The semiconductor package of claim 1, wherein the dummy via comprises a plurality of stacked dummy via layers.

11. The semiconductor package of claim 1, wherein a shape of a cross-section of the dummy via comprises one of a circular shape, a rectangular shape or a hexagonal shape.

12. The semiconductor package of claim 1, wherein the edge of the stiffener ring comprises an inner edge of the stiffener ring, and the dummy via is located between the interposer module and the stiffener ring in a plan view.

13. A method of forming a semiconductor package, the method comprising:
    forming a package substrate comprising a dummy via on a first side of the package substrate;
    mounting an interposer module on a second side of the package substrate opposite the first side of the package substrate; and
    mounting a stiffener ring on the second side of the package substrate, such that an edge of the stiffener ring is substantially aligned with the dummy via.

14. The method of claim 13, wherein the forming of the dummy via comprises forming a plurality of dummy vias constituting a dummy via array.

15. The method of claim 14, wherein the forming of the plurality of dummy vias comprises substantially aligning a centerline of the dummy via array with the edge of the stiffener ring.

16. The method of claim 15, wherein the substantially aligning of the centerline of the dummy via array comprises locating the centerline of the dummy via array such that a distance from the centerline to an edge of the dummy via array is greater than 0.1 mm and less than 2 mm.

17. The method of claim 14, wherein the forming of the plurality of dummy vias comprises forming the plurality of dummy vias such that a ratio of an area of the dummy via array to an area of a region of the package substrate including the dummy via array is greater than 0.1 and less than 0.9.

18. The method of claim 13, wherein the forming of the package substrate comprises:
    forming a core;
    forming a package substrate upper dielectric layer on the core and on the first side of the package substrate;
    forming a package substrate lower dielectric layer on the core and on the second side of the package substrate; and
    forming the dummy via in the package substrate lower dielectric layer.

19. The method of 18, further comprising:
    forming a ball grid array on the first side of the package substrate lower dielectric layer such that the dummy via is located adjacent to the ball grid array.

20. A semiconductor package comprising:
a substrate comprising:
- a core including a plurality of through vias;
- an upper dielectric layer on the core and on the first side of the substrate, and including a plurality of upper metal interconnect structures;
- a lower dielectric layer on the core and on the second side of the substrate, and including a plurality of lower metal interconnect structures electrically coupled to the plurality of upper metal interconnects by the plurality of through vias; and
- a dummy via array located in the lower dielectric layer adjacent to the plurality of lower metal interconnect structures;

an interposer module on a second side of the substrate opposite the first side of the substrate;

a stiffener ring on the second side of the substrate and including an edge that is substantially aligned with a centerline of the dummy via array, wherein a distance from the centerline of the dummy via array to an edge of the dummy via array is greater than 0.1 mm and less than 2 mm, and wherein a height of the dummy via array is less than a thickness of the lower dielectric layer; and a ball grid array on a bottom surface of the lower dielectric layer of the substrate, wherein the dummy via array is located adjacent to the ball grid array in the bottom surface of the lower dielectric layer of the substrate.

* * * * *